(12) United States Patent
Ker et al.

(10) Patent No.: US 7,705,404 B2
(45) Date of Patent: Apr. 27, 2010

(54) ELECTROSTATIC DISCHARGE PROTECTION DEVICE AND LAYOUT THEREOF

(75) Inventors: Ming-Dou Ker, Hsinchu (TW); Jia-Huei Chen, Taichung (TW); Ryan Hsin-Chin Jiang, Taipei (TW)

(73) Assignee: Amazing Microelectronic Corporation, Taipei County (TW)

( * ) Notice: Subject to any disclaimer, the term of this patent is extended or adjusted under 35 U.S.C. 154(b) by 797 days.

(21) Appl. No.: 11/613,193

(22) Filed: Dec. 20, 2006

(65) Prior Publication Data
US 2008/0151446 A1 Jun. 26, 2008

(51) Int. Cl.
*H01L 23/62* (2006.01)
(52) U.S. Cl. .................................. 257/360; 257/358
(58) Field of Classification Search ................. 257/360, 257/358, 355, 173
See application file for complete search history.

(56) References Cited

U.S. PATENT DOCUMENTS

| 5,477,414 A | * | 12/1995 | Li et al. ...................... 361/56 |
|---|---|---|---|
| 5,631,793 A | | 5/1997 | Ker et al. |
| 5,686,751 A | | 11/1997 | Wu |
| 5,689,133 A | * | 11/1997 | Li et al. ...................... 257/361 |
| 5,811,856 A | | 9/1998 | Lee |
| 6,583,972 B2 | | 6/2003 | Verhaege et al. |
| 2004/0120087 A1 | * | 6/2004 | Ishii ............................ 361/56 |
| 2007/0108527 A1 | * | 5/2007 | Lee et al. .................... 257/356 |
| 2007/0246737 A1 | * | 10/2007 | Chang ......................... 257/107 |

OTHER PUBLICATIONS

Ming-Dou Ker et al. "Equal-Substrate-Potential Technique for ESD Protection Design" M. A. thesis published. Jun. 2006, pp. 1-15.

* cited by examiner

*Primary Examiner*—S. V Clark
(74) *Attorney, Agent, or Firm*—Jianq Chyun IP Office

(57) ABSTRACT

An electrostatic discharge (ESD) protection device and a layout thereof are provided. A bias conducting wire is mainly used to couple each base of a plurality of parasitic transistors inside ESD elements together, in order to simultaneously trigger all the parasitic transistors to bypass the ESD current, avoid the elements of a core circuit being damaged, and solve the non-uniform problem of bypassing the ESD current when ESD occurs. Furthermore, in the ESD protection layout, it only needs to add another doped region on a substrate neighboring to, but not contacting, doped regions of the ESD protection elements and use contacts to connect the added doped region, so as to couple each base of the parasitic transistors together without requiring for additional layout area.

39 Claims, 19 Drawing Sheets

ELECTROSTATIC DISCHARGE PROTECTION DEVICE AND LAYOUT THEREOF

BACKGROUND OF THE INVENTION

1. Field of the Invention

The present invention relates to an ESD protection device and a layout thereof. More particularly, the present invention relates to an ESD protection device with equal-substrate-potential technology and a layout thereof.

2. Description of Related Art

Electronic products are often impacted by ESD in practical use. Generally speaking, an ESD voltage is much higher than a common supply voltage, and discharge models can be classified into human-body model (HBM), machine model (MM), and charge-device model (CDM) based on different voltage levels generated by ESD. When ESD occurs, the ESD current is likely to burn the elements, such that some ESD protection measures must be taken in the circuit to effectively isolate the ESD current, so as to prevent the elements from being damaged.

Commonly, a design of ESD protection device is disposed between a core circuit and a pad to protect internal circuits. There are several tests for ESD protection devices, which can be classified into PD, PS, ND, and NS modes. The PD/ND mode inputs a positive pulse/negative pulse via the pad to bypass the ESD current to the conducting wire of a system voltage VDD. The PS/NS mode inputs a positive pulse/negative pulse via the pad to bypass the ESD current to the conducting wire of a ground voltage VSS.

FIG. 1 is a block view of an ESD protection circuit. Referring to FIG. 1, the PD mode inputs a positive pulse 105 via a pad 101 and uses an ESD protection device 102 to bypass an ESD current to the system voltage trace VDD, so as to protect a core circuit 104. The NS mode inputs a negative pulse 106 via the pad 101 and uses an ESD protection device 103 to bypass an ESD current to the ground voltage trace VSS, so as to protect the core circuit 104. The operations of the PS, ND modes can be deduced in the same way. Further, electrostatic charges may be accumulated during the operation of the core circuit 104, so the electrostatic charges generated by the core circuit 104 can also be bypassed and discharged by the ESD protection devices 102, 103.

A conventional ESD protection circuit is usually implemented by a gate-grounded n-channel metal-oxide-semiconductor (GGNMOS) transistor. FIG. 2 shows an ESD protection device implemented by a GGNMOS transistor. Referring to FIG. 2, when a core circuit 204 operates normally, as the gate of an NMOS transistor MN1 is grounded, the NMOS transistor MN1 is turned off and will not be conducted. When ESD occurs, a high voltage 205 enters via a pad 201. When the high voltage 205 exceeds a drain/substrate breakdown voltage of the NMOS transistor, the drain/substrate of the NMOS transistor may be broken down and generate a bulk current which triggers parasitic transistors inside the NMOS transistor to bypass the ESD current.

As the ESD protection circuit withstands the high voltage ESD, a channel width of several hundreds of microns is required in the layout. Thus, a layout of multi-finger type is used to reduce the occupied silicon area. However, the above layout manner may result in a different base resistance of a lateral parasitic bipolar junction transistor (BJT) inside each finger of the NMOS transistor, i.e., the parasitic transistor closer to a central circuit has a higher base resistance. When a snapback breakdown of an NMOS transistor occurs, the ESD current may be concentrated and conducted to a ground terminal via the lateral parasitic BJT of the broken-down NMOS transistor. As the NMOS transistor that has been broken down lowers the potential of the conducting wire coupled thereto, the ESD pulse will not trigger other NMOS transistors, thus causing a non-uniform problem of bypassing the ESD current and weakening the ESD protection ability. In order to solve the above problems, the base resistances of the parasitic transistors must be substantially the same.

FIG. 3A is a top view of an ESD protection circuit layout according to U.S. Pat. No. 5,811,856. FIG. 3B is a sectional view of the ESD protection circuit layout according to the U.S. Pat. No. 5,811,856. Referring to FIGS. 3A and 3B, the ESD protection circuit can be regarded as the ESD protection device 103 in FIG. 1. The guard-ring formed by a P+ doped region 301 is used to avoid ESD current drain. A gate 302 and N+ doped regions 303, 304 form a GGNMOS transistor, and the N+ doped regions 303, 304 and a substrate 308 form a parasitic transistor 309. N+ doped regions 307, 311, and the substrate 308 form a parasitic transistor 312. Moreover, the N+ doped regions 305, 307 and the substrate 308 form a parasitic transistor 310.

A method of solving the non-uniform problem of bypassing the ESD current involves embedding a grounded P+ diffusion region 306 into the source 304 of a neighboring NMOS transistor, and making the base resistances of the parasitic transistors 309, 310, 312 being substantially the same, so as to simultaneously trigger the parasitic transistors to bypass the ESD current. However, the layout of embedding the P+ diffusion region 306 not only increases the layout area, but also results in an over low substrate resistance of the NMOS transistor in a deep-submicron complementary metal-oxide-semiconductor (CMOS) transistor process, thus making it difficult to trigger the internal parasitic transistors and bypass the ESD current in time to protect the core circuit.

FIG. 4 shows an ESD protection circuit disclosed in "Layout design on multi-finger MOSFET for on-chip ESD protection circuits in a 0.18-um Salicided CMOS process" (Proc. IEEE Int. Symp. Electronics, Circuits and Systems, 2001, pp. 361-364) published by Mr. M.-D. Ker, C.-H. Chuang, and W.-Y. Lo. Referring to FIG. 4, another method of solving the non-uniform problem of bypassing the ESD current involves coupling a sensing circuit to the gate of an MOS transistor. The sensing circuit is generally constituted by a resistor RP1 (or RN1) and a capacitor CP1 (or CN1). When the sensing circuit senses the occurrence of an ESD event, the sensing circuit provides a bias to the gates of MOS transistors MP1, MP2 (or MN1, MN2), so as to simultaneously turn on the transistors MP1, MP2 (or MN1, MN2) to bypass the ESD current. The PMOS transistors MP1, MP2, capacitor CP1, and resistor RP1 can be regarded as internal elements of the ESD protection device 102 in FIG. 1. The NMOS transistors MN1, MN2, capacitor CN1, and resistor RN1 can be regarded as internal elements of the ESD protection device 103 in FIG. 1. The resistors RN1, RP1 and capacitors CN1, CP1 can be adjusted to provide a bias to the gates of the NMOS transistors MN1, MN2 and PMOS transistors MP1, MP2 to reduce the trigger voltage of the NMOS transistors MN1, MN2 and PMOS transistors MP1, MP2. Thus, when ESD occurs, a smaller trigger voltage can trigger the NMOS transistors MN1, MN2 or PMOS transistors MP1, MP2 in time to bypass the ESD current. However, the high bias applied on the gate of the NMOS transistor MN1/PMOS transistor MP1 may generate a larger channel current, and a higher electric field may cause the breakdown of a thin gate-oxide layer, thus weakening the ESD protection ability. In addition, the impedance of the resistors RN1, RP1 in a common sensing circuit is extremely high (approximately 100 kilo-ohm), which may also increase the layout area.

FIG. 5 shows an ESD protection circuit according to the U.S. Pat. No. 5,631,793. Referring to FIG. 5, the NMOS transistors MN1, resistor RN1, and capacitor CN1 are internal elements of the ESD protection device 103 in FIG. 1. A method of solving the non-uniform problem of bypassing the ESD current involves electrically connecting a sensing circuit to the substrate of the GGNMOS transistors MN1, MN2. The sensing circuit is constituted by a resistor RN1 and a capacitor CN1. The resistor RN1 and the capacitor CN1 can be adjusted to provide an appropriate voltage to the bodies of the parasitic transistors (i.e., the substrates of the GGNMOS transistors MN1, MN2), so as to increase the base voltage of the parasitic transistors, i.e., reducing the trigger voltage of the GGNMOS transistors MN1, MN2, such that the internal parasitic transistors can be triggered simultaneously to solve the non-uniform problem of bypassing the ESD current. Therefore, it is not necessary to apply a bias to the gates of the NMOS transistors MN1, MN2, thus avoiding generating an extra channel current that weakens the ESD protection ability. However, the additional resistor RN1 and capacitor CN1 may also increase the layout area.

FIG. 6 shows an ESD protection circuit according to the U.S. Pat. No. 5,686,751. Referring to FIG. 6, a technology of solving the non-uniform problem of bypassing the ESD current involves triggering each finger of the NMOS transistor in a domino manner. In FIG. 6, Rd1-Rdi are respectively ballast resistors of the drains of NMOS transistors MN1-MNi, and Rs1-Rsi are respectively ballast resistors of the sources of the NMOS transistors MN1-MNi. The NMOS transistors MN1-MNi and resistors Rd1-Rdi, Rs1-Rsi are internal elements of the ESD protection device 103 in FIG. 1. When ESD occurs, as long as one of the NMOS transistors (for example, the NMOS transistor MN1) is triggered, the ESD current provides a voltage to the gate of the NMOS transistor MN2 via the ballast resistor Rs1. The triggered NMOS transistor MN2 then allows the ESD current to pass through the ballast resistor Rs2 to provide a voltage to the gate of the NMOS transistor MN3. The NMOS transistors MN3-MNi are triggered in the same way. However, though the non-uniform problem of bypassing the ESD current can be solved by the above conventional art, the complexity of the layout is increased.

SUMMARY OF THE INVENTION

An ESD protection device is provided by the present invention. Under a high voltage ESD, a plurality of ESD protection units can be triggered simultaneously to bypass the ESD current in time, so as to solve the non-uniform problem of bypassing the ESD current. In addition, when a core circuit under a small power supply operates together with an input/output interface (I/O interface) under a high voltage via an I/O pad, the ESD protection device can also work normally under a mixed-voltage operation.

An ESD protection device provided by the present invention can be applied to an output buffer with ESD protection ability which receives an output signal from the core circuit to control the ESD protection device to output an external signal, so as to enhance the output driving ability of the core circuit.

An ESD protection layout provided by the present invention is an implementation of the above ESD protection device. In a limited layout area, a doped region is disposed in the substrate, and a bias conducting wire is used to electrically connect the doped region, thus the base coupling manner of the parasitic transistors in the ESD protection device is completed. Under a high voltage ESD, the parasitic transistors can be triggered simultaneously to bypass the ESD current in time, so as to avoid the non-uniform problem of bypassing the ESD current.

In order to solve the above problem, an ESD protection device comprising a plurality of ESD protection units and a bias conducting wire is provided. A plurality of ESD protection units is used to transmit an electrostatic current between a first conductive path and a second conductive path, wherein each ESD protection unit comprises a parasitic transistor and a parasitic resistor. A collector and an emitter of each parasitic transistor are respectively coupled to the first conductive path and the second conductive path, and each parasitic resistor is coupled between a base of the corresponding parasitic transistor and the second conductive path. The bias conducting wire is coupled to each base of the above parasitic transistors.

An ESD protection device comprising a plurality of output driving units and a bias conducting wire is further provided. The plurality of output driving units is used to generate an external output signal according to a core output signal and output the external output signal to a first conductive path, wherein each output driving unit comprises a parasitic transistor and a parasitic resistor. A collector and an emitter of each parasitic transistor are respectively coupled to the first conductive path and a second conductive path, and each parasitic resistor is coupled between the base of the corresponding parasitic transistor and the second conductive path. The bias conducting wire is coupled to each base of the above parasitic transistors.

An ESD protection device comprising a plurality of transistors, a plurality of resistors, and a bias conducting wire is still provided. A collector and an emitter of each transistor are respectively coupled to a first conductive path and a second conductive path, for transmitting an electrostatic current between the first conductive path and the second conductive path. The plurality of resistors is respectively coupled between the base of the corresponding transistor and the second conductive path. The bias conducting wire is coupled to each base of the above transistors.

An ESD protection layout comprising a substrate, a first doped region, a first conductive path, a second conductive path, a plurality of ESD protection units, a plurality of second doped regions, and a bias conducting wire is further provided. The substrate has a parasitic resistor. The first doped region is disposed on the substrate, and serves as an electrode of the substrate. The first conductive path is disposed above the substrate. The second conductive path is disposed above the substrate. Each of the above ESD protection units is disposed on the substrate without contacting the first doped region, for transmitting an electrostatic current between the first conductive path and the second conductive path, wherein each ESD protection unit has a parasitic transistor structure. The plurality of second doped regions is disposed on the substrate between the ESD protection units, wherein each second doped region does not contact any of the ESD protection units. The bias conducting wire is disposed above the substrate, and is electrically connected to each of the above second doped regions.

An ESD protection layout comprising a substrate, a first doped region, a first conductive path, a second conductive path, a plurality of ESD protection units, a plurality of third doped regions, and a bias conducting wire is also provided. The first doped region is disposed on the substrate, and serves as an electrode of the substrate. The first and second conductive paths are respectively disposed above the substrate. The plurality of ESD protection units is disposed on the substrate without contacting the first doped region, for transmitting an electrostatic current between the first conductive path and the second conductive path, wherein each ESD protection unit comprises a first MOS transistor and a second MOS transistor connected in series between the first conductive path and the second conductive path. The plurality of third doped regions is disposed in the substrate and between the first and second MOS transistors without contacting the two MOS transistors. The bias conducting wire is disposed above the substrate, and is electrically connected to each of the above third doped regions.

The present invention couples the bases of the parasitic transistors inside the ESD protection units together, for simultaneously triggering the ESD protection units to bypass the ESD current when a high voltage ESD passes through the ESD protection device. Moreover, when the devices operating under different voltages works together, the ESD protection device can work normally under the mixed-voltage operation. Further, the ESD protection device is coupled to a preceding driving device to discharge the charges generated by the preceding driving device.

In order to make the features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
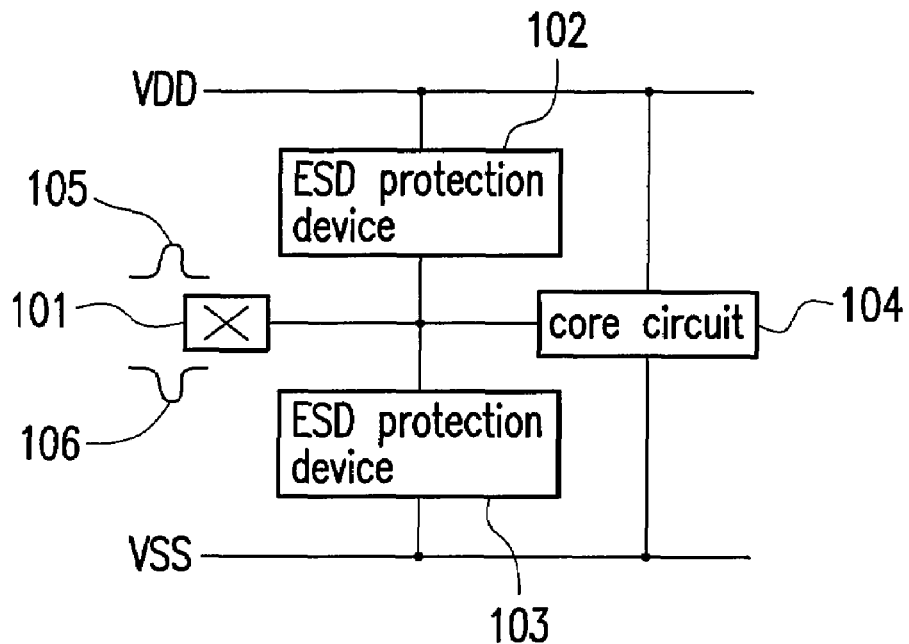
FIG. 1 is a block diagram of an ESD protection circuit.
Figure 2:
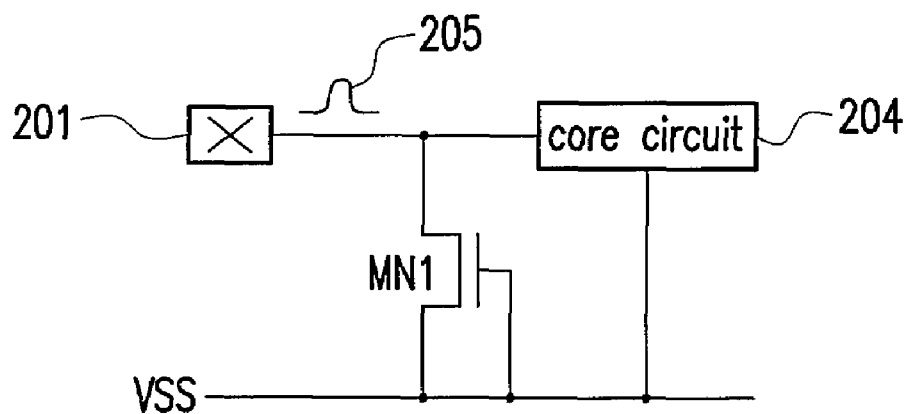
FIG. 2 shows an ESD protection device implemented by a GGNMOS transistor.
Figure 3A:
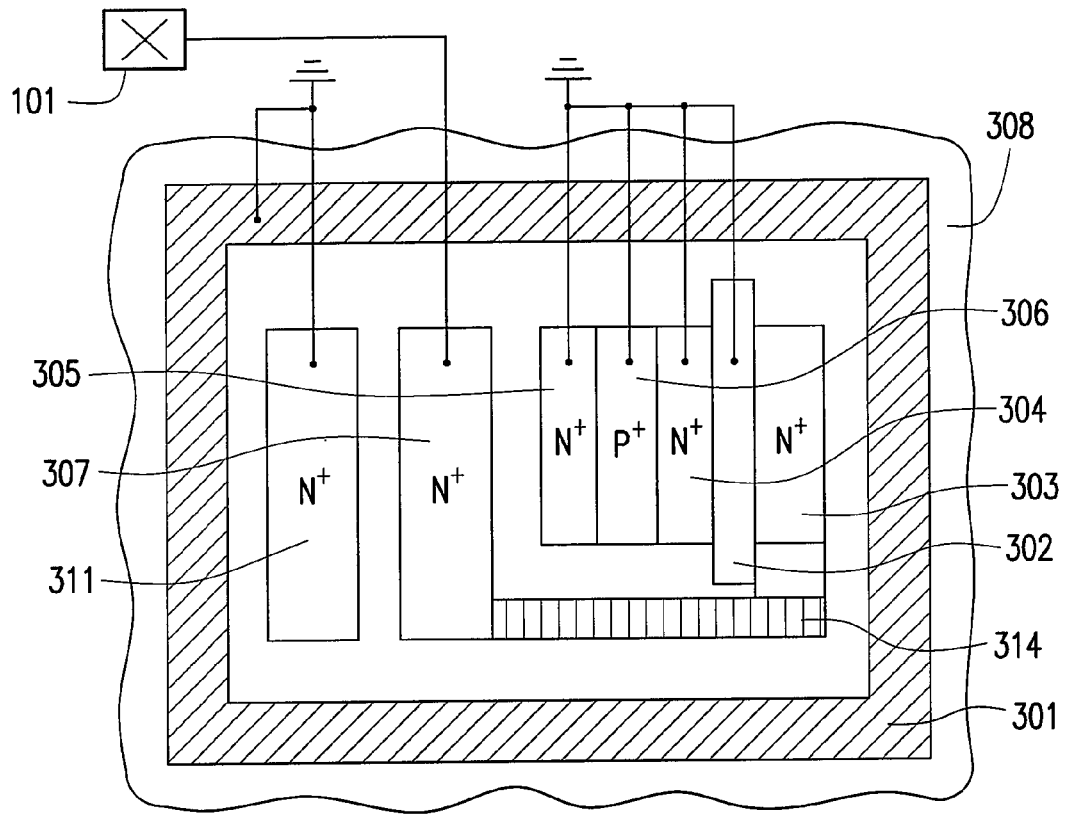
FIG. 3A is a top view of a conventional ESD protection circuit layout.
Figure 3B:
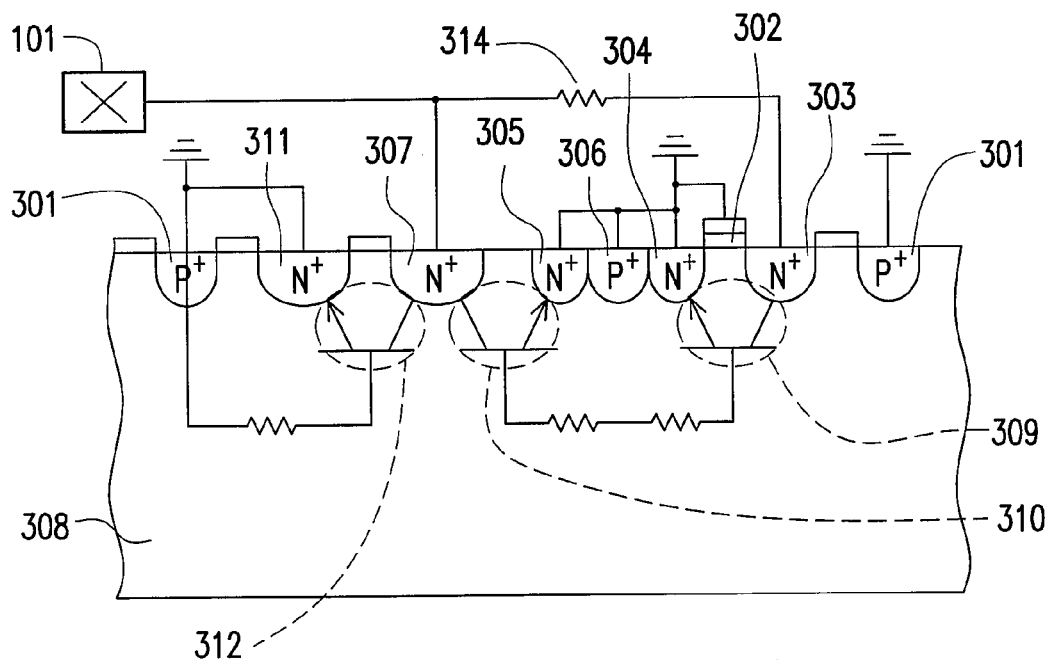
FIG. 3B is a sectional view of a conventional ESD protection circuit layout.
Figure 4:
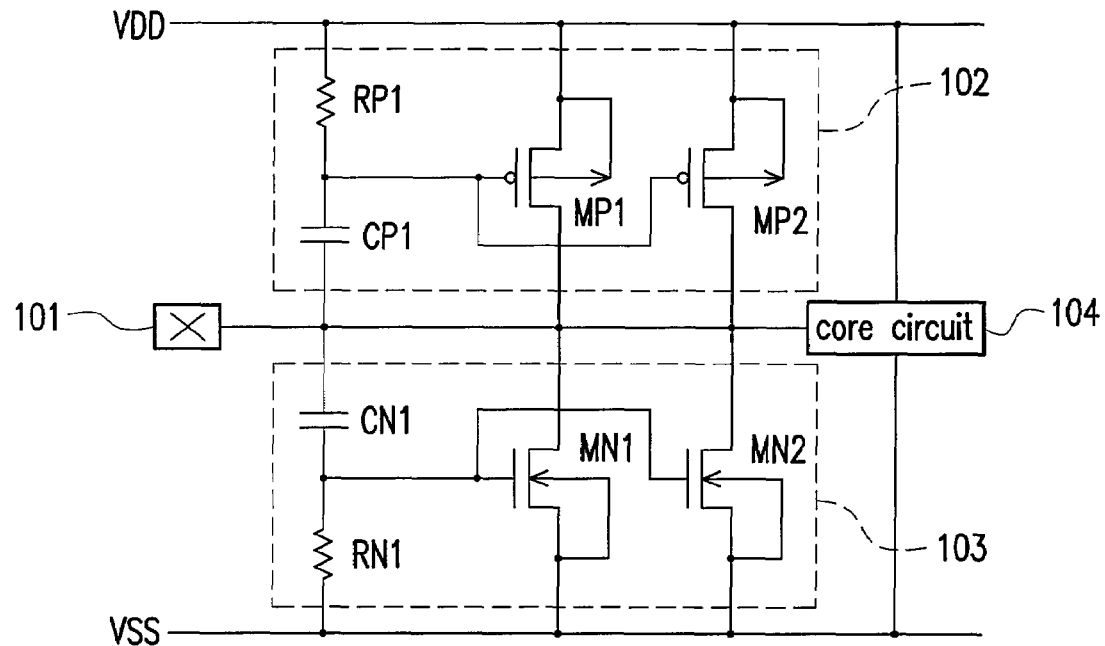
FIG. 4 is a conventional ESD protection circuit.
Figure 5:
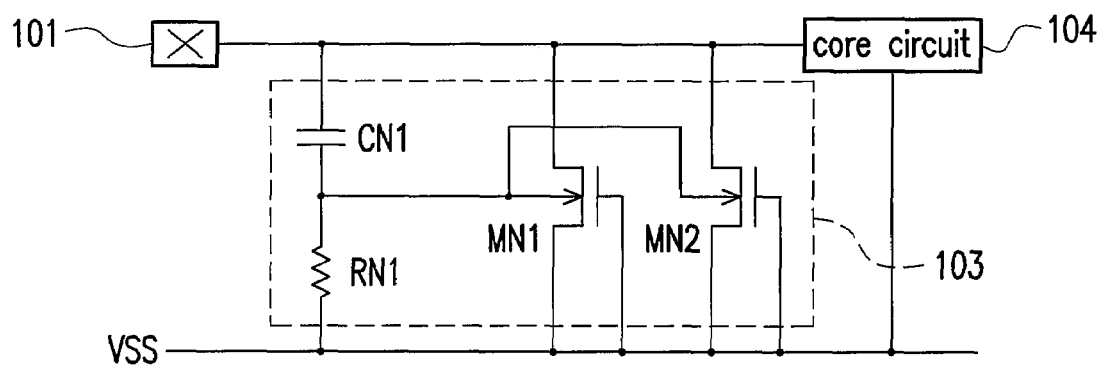
FIG. 5 is a conventional ESD protection circuit.
Figure 6:
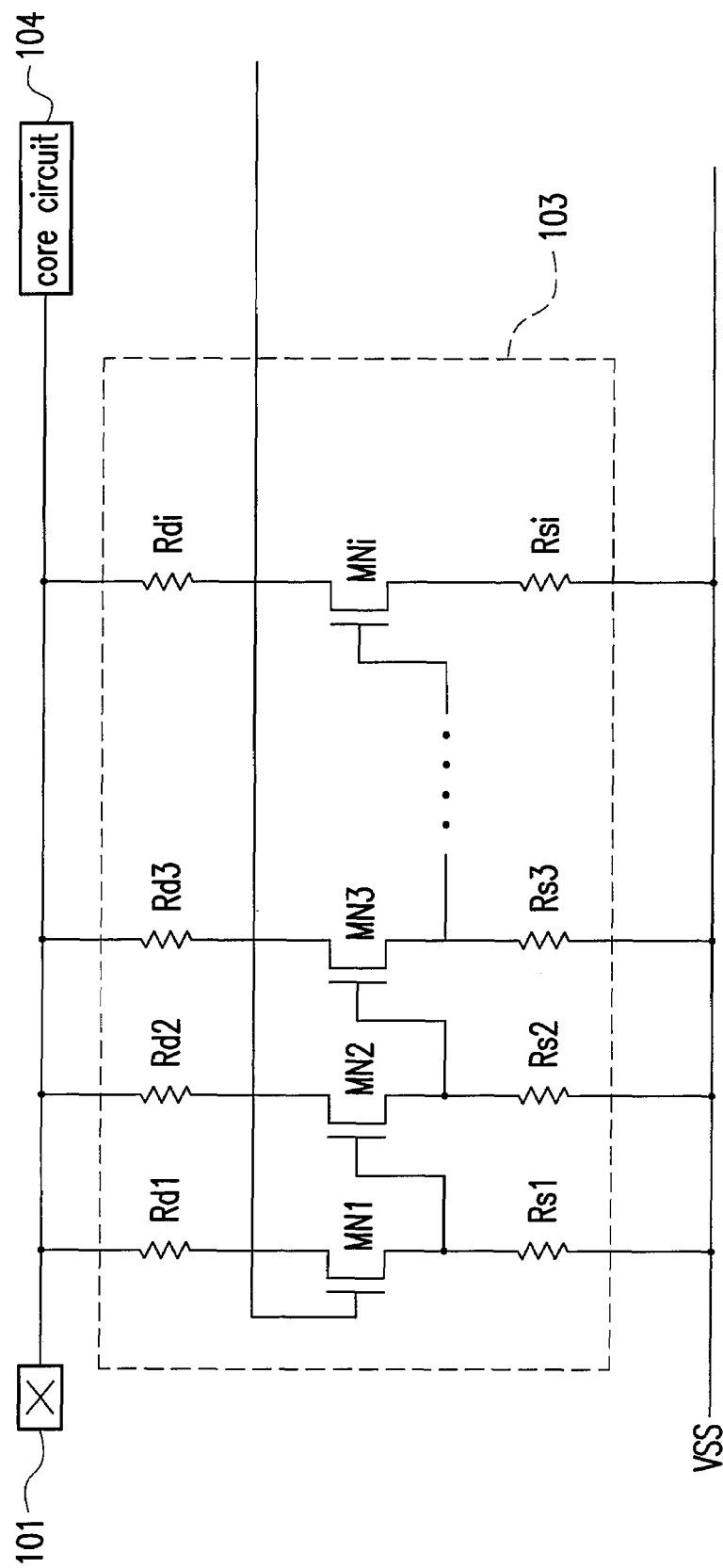
FIG. 6 is a conventional ESD protection circuit.
Figure 7:
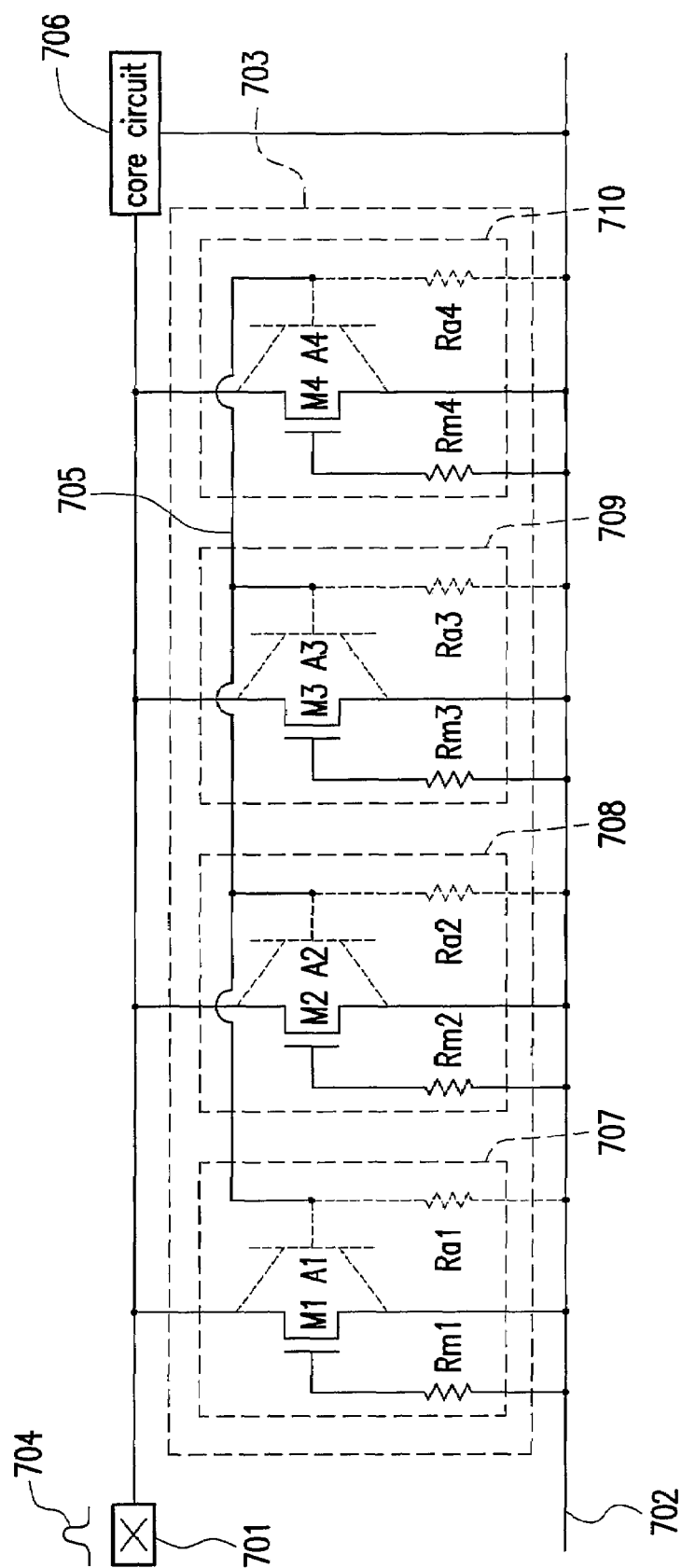
FIG. 7 is an ESD protection device according to a preferred embodiment of the present invention.

FIG. 7 is an ESD protection device according to a preferred embodiment of the present invention. Referring to FIG. 7, an ESD protection device 703 is coupled between a pad 701 and a second conductive path (for example, a ground voltage trace) 702. The pad 701 is coupled to a core circuit 706 via a first conductive path, and the pad 701 can be an input pad or an output pad. The ESD protection device 703 mainly includes ESD protection units 707-710 and a bias conducting wire 705. This embodiment adopts, for example, a multi-finger type layout manner to implement the ESD protection device 703, so as to reduce the occupied silicon area. Herein, only four ESD protection units 707-710 are taken as an example for illustration, and those of ordinary skill in the art can determine the number of the ESD protection unit as required.

Each of the ESD protection units 707-710 in this embodiment has an NMOS transistor (i.e., M1-M4 in FIG. 7). As the NMOS transistors M1-M4 are disposed in the substrate, each of the ESD protection units 707-710 has a parasitic transistor A1-A4 and a parasitic resistor (substrate resistor) Ra1-Ra4. Resistors Rm1-Rm4 are respectively coupled between the gates of the NMOS transistors M1-M4 and the voltage trace 702. Those of ordinary skill in the art can omit the resistors Rm1-Rm4 as required, i.e., directly coupling the gates of the NMOS transistors M1-M4 to the voltage trace 702. In other embodiment, the gates of the NMOS transistors M1-M4 is floating.

When ESD occurs, a high voltage 704 enters via the pad 701. If the high voltage 704 exceeds the breakdown voltage between the drain and body of any (for example, the transistor M2) of the NMOS transistors M1-M4, the interface between the drain and body of the NMOS transistor M2 may be broken down to generate a bulk current. When the bulk current passes through a parasitic resistor Ra2, a bias voltage is generated. As the bias conducting wire 705 is used to connect the bases of the parasitic transistors A1-A4, the bias voltage not only triggers the parasitic transistor A2, but also simultaneously triggers other parasitic transistors A1, A3, A4. At this time, the parasitic transistors A1-A4 bypass the ESD current through the first conductive path to the second conductive path (herein, a ground voltage trace) 702, so as to prevent the ESD damaging the elements of the core circuit 706, thus solving the non-uniform problem of bypassing the ESD current.

According to another embodiment of the present invention, the second conductive path 702 is a system voltage trace. If the second conductive path 702 is a system voltage trace, PMOS transistors can be used to substitute the NMOS transistors M1-M4 in the ESD protection device 703, in FIG. 7.

Figure 8:
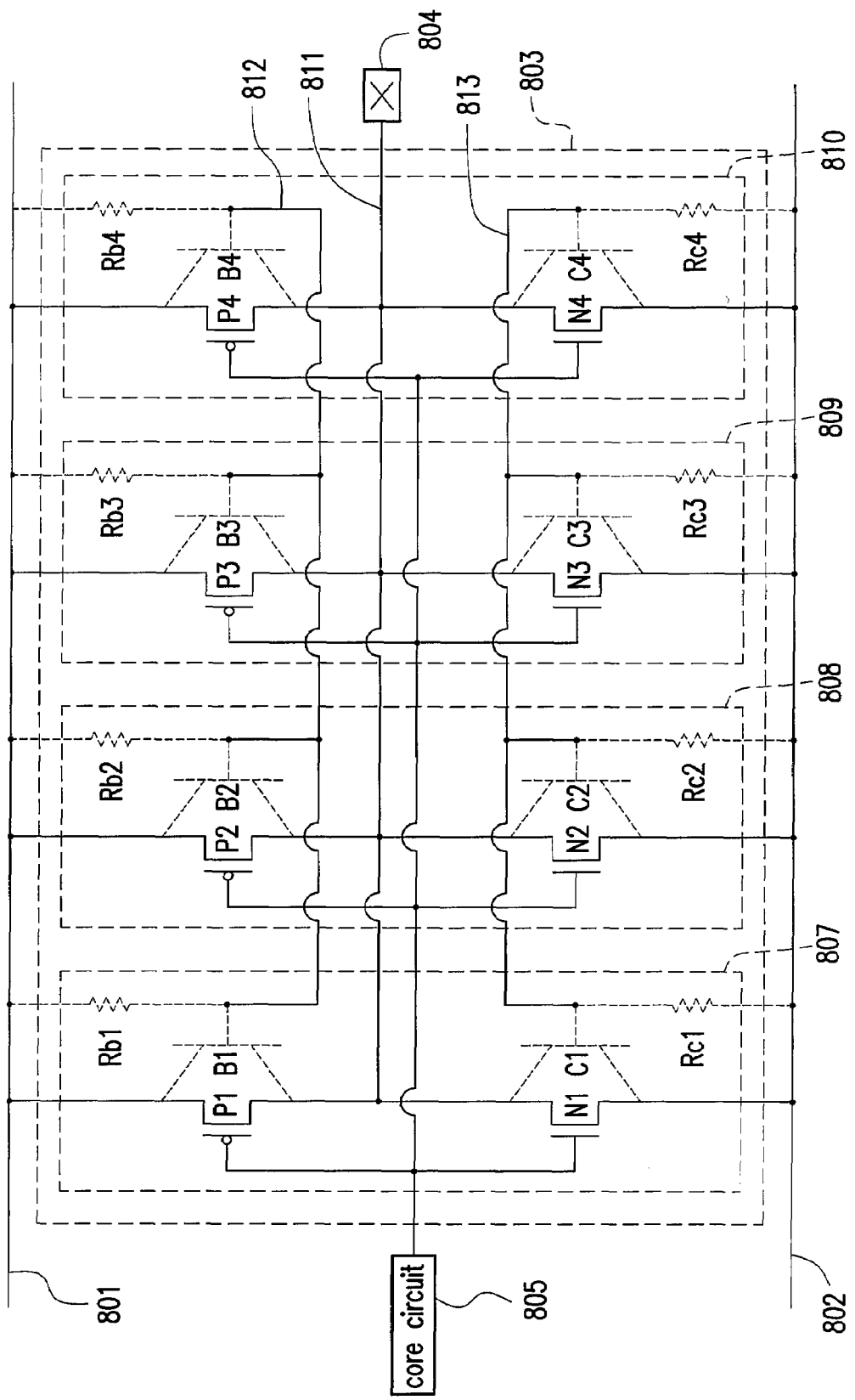
FIG. 8 is an ESD protection device according to a preferred embodiment of the present invention.

FIG. 8 shows an ESD protection device according to a preferred embodiment of the present invention. Referring to FIG. 8, the ESD protection device 803 can be used as a buffer. The ESD protection device 803 is coupled between a third conductive path (for example, a system voltage trace 801) and a second conductive path (for example, a ground voltage trace 802). The ESD protection device 803 mainly includes output driving units (or ESD protection units) 807-810, a bias conducting wire 812, and a bias conducting wire 813. This embodiment uses, for example, a multi-finger type layout manner to implement the ESD protection device 803. Herein, only four ESD protection units 807-810 are taken as an example for illustration, and those of ordinary skill in the art can determine the number of the ESD protection unit as required.

Each of the output driving units 807-810 in this embodiment has an NMOS transistor N1-N4 and a PMOS transistor P1-P4. The transistors N1-N4 and P1-P4 are connected in series between the second conductive path (for example, the ground voltage trace 802) and the third conductive path (for example, the system voltage trace 801) (as shown in FIG. 8). As the NMOS transistors N1-N4 are disposed on the substrate, each of the output driving units 807-810 has a parasitic transistor C1-C4 and a parasitic resistor Rc1-Rc4. As the PMOS transistors P1-P4 are disposed on the substrate, each of the output driving units 807-810 also has a parasitic transistor B1-B4 and a parasitic resistor Rb1-Rb4.

In this embodiment, the ESD protection device 803 serves as an output buffer of a core circuit 805. Each of the output driving units 807-810 generates an external output signal according to a core output signal output by the core circuit 805 and outputs the external output signal to a pad 804 via a first conductive path 811. As the bias conducting wire 813 couples the bases of the parasitic transistors C1-C4 together, and the bias conducting wire 812 couples the bases of the parasitic transistors B1-B4 together, when ESD occurs, if any of the output driving units 807-810 is broken down due to the ESD, the bias voltage generated by the ESD current passing through a parasitic resistor turns on the parasitic transistors B1-B4 and the parasitic transistors C1-C4 via the bias conducting wires 812, 813.

For example, when the interface between the drain and body of the transistor N2 (or P2) is broken down due to the occurrence of ESD, the electrostatic current may pass through the parasitic resistor Rc2 (or Rb2) to generate a bias voltage. As the bias conducting wire 813 (or 812) is used to connect the bases of the parasitic transistors C1-C4 (or B1-B4), the bias voltage simultaneously triggers other parasitic transistors C1, C3, C4 (or B1, B3, B4). Therefore, when ESD occurs, all the output driving units 807-810 are triggered. The ESD current is bypassed to the third conductive path (for example, the system voltage trace 801) and/or the second conductive path (for example, the ground voltage trace 802) via each of the output driving units 807-810, so as to prevent the electrostatic current damaging the elements inside the core circuit 805, thus solving the non-uniform problem of bypassing the ESD current.

Figure 9:
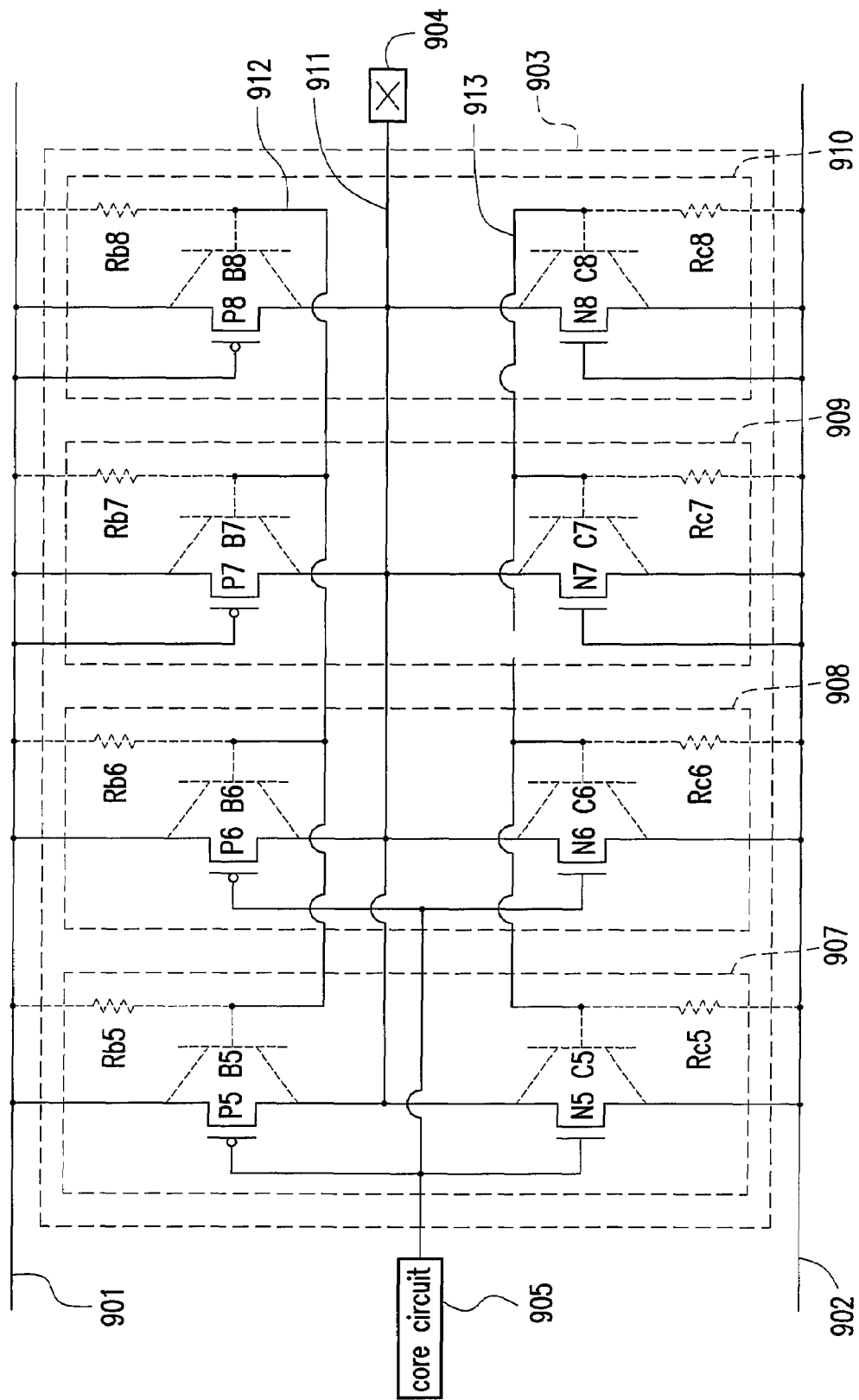
FIG. 9 is an ESD protection device according to a preferred embodiment of the present invention.

FIG. 9 shows an ESD protection device according to a preferred embodiment of the present invention. The ESD protection device 903 is coupled between a third conductive path (for example, a system voltage trace 901) and a second conductive path (for example, a ground voltage trace 902). The ESD protection device 903 mainly includes output driving units 907, 908, ESD protection units 909, 910, and bias conducting wires 912, 913. This embodiment uses, for example, a multi-finger type layout manner to implement the ESD protection device 903. Herein, only two output driving units 907, 908 and two ESD protection units 909, 910 are taken as an example for illustration, and those of ordinary skill in the art can determine the number of the output driving unit and ESD protection unit as required.

Each of the output driving units 907, 908 in this embodiment has a PMOS transistor P5, P6 and an NMOS transistor N5, N6. Each of the ESD protection units 909, 910 has an NMOS transistor N7, N8 and a PMOS transistor P7, P8. The transistors N5-N8 and P5-P8 are connected in series between the second conductive path and the third conductive path (as shown in FIG. 9). Each of the transistors N5-N8 has a parasitic transistor C5-C8 and a parasitic resistor Rc5-Rc8. Each of the transistors P7, P8 has a parasitic transistor B5-B8 and a parasitic resistor Rb5-Rb8. The bias conducting wire 913 couples the bases of the parasitic transistors C5-C8 together, and the bias conducting wire 912 couples the bases of the parasitic transistors B5-B8 together.

In this embodiment, the ESD protection device 903 serves as an output buffer of a core circuit 905. Each of the output driving units 907, 908 generates an external output signal according to a core output signal output by the core circuit 905 and outputs the external output signal to a pad 904 via a first conductive path 911. Referring to FIG. 9, as the bias conducting wire 912 couples the bases of the parasitic transistors B5-B8 together, and the bias conducting wire 913 couples the bases of the parasitic transistors C5-C8 together. When ESD occurs, if any of the output driving units 907, 908 or ESD protection units 909, 910 is broken down due to the ESD, the bias voltage generated by the ESD current passing through a parasitic resistor turns on other parasitic transistors via the bias conducting wires 912, 913.

For example, when the interface between the drain and body of the transistor N7 (or P7) is broken down due to the occurrence of ESD, the electrostatic current may pass through the parasitic resistor Rc7 (or Rb7) to generate a bias voltage. As the bias conducting wire 913 (or 912) is used to connect the bases of the parasitic transistors C5-C8 (or B5-B8), the bias voltage simultaneously triggers other parasitic transistors C5, C6, C8 (or B5, B6, B8). Therefore, when ESD occurs, all the output driving units 907, 908 and the ESD protection units 909, 910 are triggered. The ESD current is bypassed to the third conductive path (for example, the system voltage trace 901) and/or the second conductive path (for example, the ground voltage trace 902) via the output driving units 907, 908 and the ESD protection units 909, 910, so as to prevent the electrostatic current damaging the elements inside the core circuit 905, thus solving the non-uniform problem of bypassing the ESD current.

Moreover, along with the progress of semiconductor transistor process, the supply voltage required by a core circuit becomes smaller, so as to reduce the power consumption and heat dissipation. However, the core circuit operating under a low voltage is still likely to work together with other I/O interfaces operating under a high supply voltage. In such a mixed-voltage operation, the ESD protection device must maintain the ESD protection ability still remains when the core circuit works under a high voltage, so as to improve the voltage tolerance of the ESD protection device.

Figure 10:
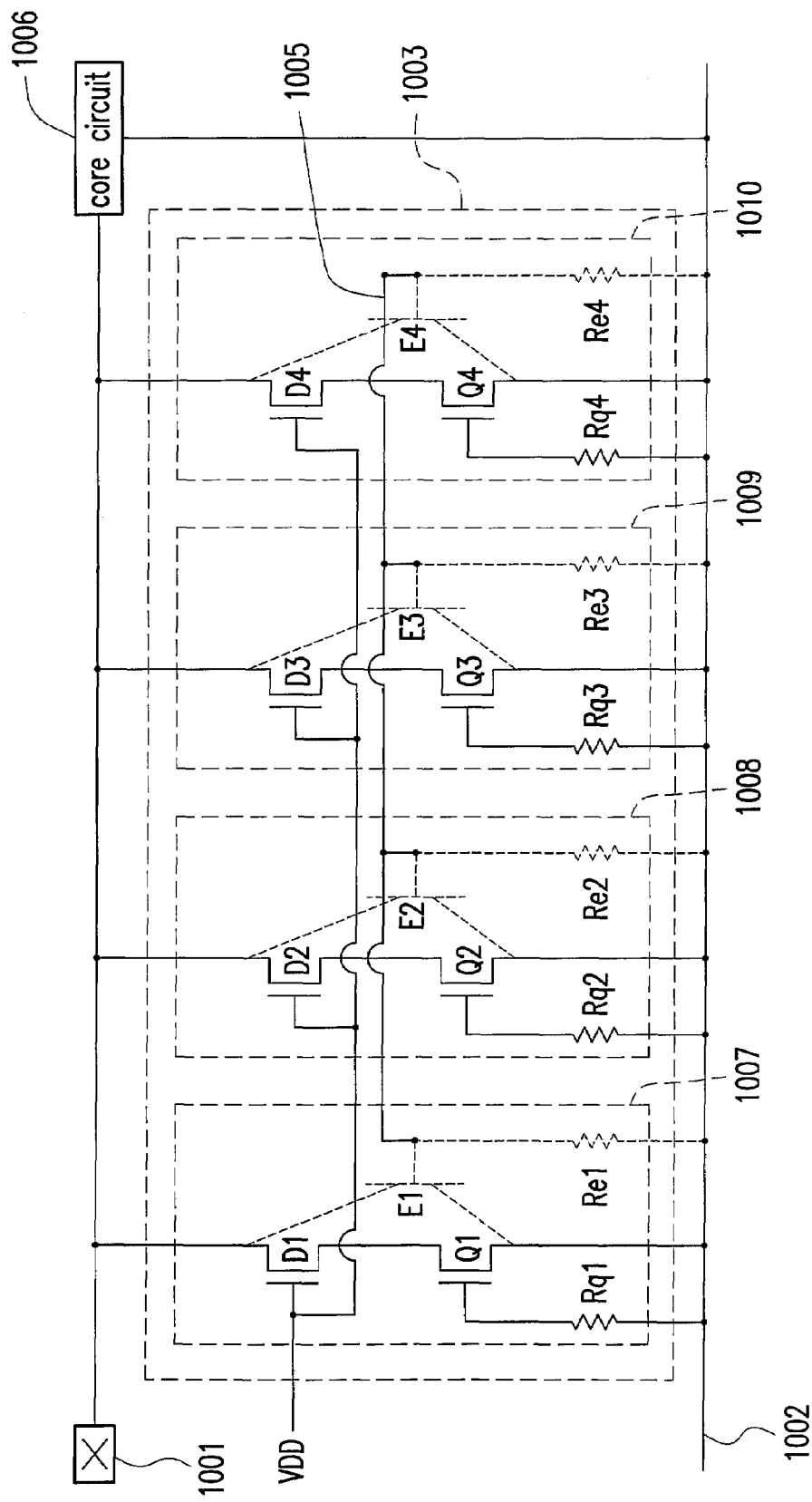
FIG. 10 is an ESD protection device according to a preferred embodiment of the present invention.

FIG. 10 shows an ESD protection device according to a preferred embodiment of the present invention. Referring to FIG. 10, a pad 1001 is coupled to a core circuit 1006 via a first conductive path. The ESD protection device 1003 is coupled between the first conductive path and a second conductive path (for example, a ground voltage trace 1002). The pad 1001 can be an input pad or an output pad. The ESD protection device 1003 mainly includes ESD protection units 1007-1010 and a bias conducting wire 1005. This embodiment uses, for example, a multi-finger type layout manner to implement each of the ESD protection units, so as to reduce the occupied silicon area. Herein, only four ESD protection units 1007-1010 are taken as an example for illustration, and those of ordinary skill in the art can determine the number of the ESD protection unit as required.

Each of the ESD protection units 1007-1010 in this embodiment has a first MOS transistor (for example, an NMOS transistor Q1-Q4) and a second MOS transistor (for example, an NMOS transistor D1-D4). The first and second MOS transistors are connected in series between the first conductive path and the second conductive path (for example, the ground voltage trace 1002) (as shown in FIG. 10). The gates of the transistors Q1-Q4 are coupled to the second conductive path. The gates of the transistors D1-D4 are coupled to a third conductive path (for example, a system voltage trace VDD). As the NMOS transistors Q1-Q4, D1-D4 are disposed on the substrate, each of the ESD protection units 1007-1010 has a parasitic transistor E1-E4 and a parasitic resistor Re1-Re4. Resistors Rq1-Rq4 are respectively coupled between the gates of the NMOS transistors Q1-Q4 and the ground voltage trace 1002, and those of ordinary skill in the art can omit the resistors Rq1-Rq4 as required, i.e., directly coupling the gates of the NMOS transistors Q1-Q4 to the ground voltage trace 1002. In other embodiment, the gates of the NMOS transistors Q1-Q4 is floating.

Referring to FIGS. 7 and 10, the difference between FIGS. 7 and 10 is that the NMOS transistors Q1-Q4 are respectively connected in series with the NMOS transistors D1-D4, so as to improve the trigger voltage of each of the high ESD protection units 1007-1010, thus making the ESD protection device 1003 have a high voltage tolerance. As the bias conducting wire 1005 couples the bases of the parasitic transistors E1-E4 together, when ESD occurs, if any of the ESD protection units 1007-1010 is broken down due to the ESD, the bias voltage generated by the ESD current turns on the parasitic transistors E1-E4 via the bias conducting wire 1005. The gates of the NMOS transistors D1-D4 are coupled to the system voltage VDD and conducted. Those of ordinary skill in the art should understand that the same purpose can be achieved by coupling the gates of the PMOS transistors to the ground voltage VSS, and this embodiment will not be limited herein.

Figure 11:
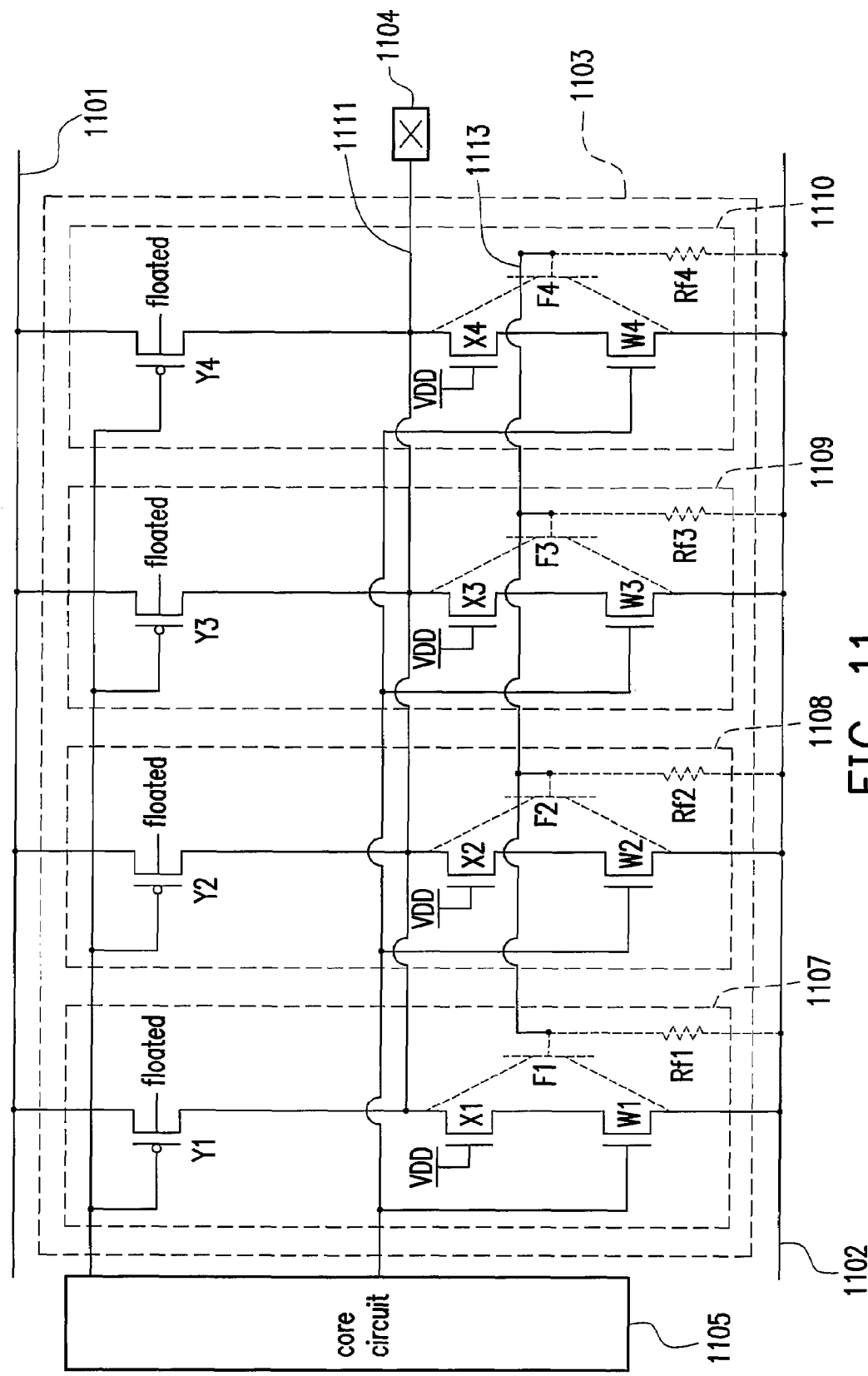
FIG. 11 is an ESD protection device according to a preferred embodiment of the present invention.

FIG. 11 shows the equivalent circuit of aqual-substrate-potential stacked-NMOS used as an ESD protection device according to a preferred embodiment of the present invention. Referring to FIG. 11, the ESD protection device 1103 can be used as a self-protecting output buffer. The ESD protection device 1103 is coupled between a third conductive path (for example, a system voltage trace 1101) and a second conductive path (for example, a ground voltage trace 1102). The ESD protection device 1103 mainly includes a plurality of output driving units (only four output driving units 1107-1110 are illustrated in FIG. 11), and bias conducting wires 1113.

Each of the output driving units 1107-1110 in this embodiment has an NMOS transistor W1-W4, an NMOS transistor X1-X4, and a PMOS transistor Y1-Y4. Each of the output driving units 1107-1110 has a parasitic transistor F1-F4, and a parasitic resistor Rf1-Rf4. The bias conducting wire 1113 couples the bases of the parasitic transistors F1-F4 together.

In this embodiment, the ESD protection device 1103 serves as an output buffer of a core circuit 1105. Each of the output driving units 1107-1110 generates an external output signal according to a core output signal output by the core circuit 1105 and outputs the external output signal to a pad 1104 via a first conductive path 1111. Referring to FIGS. 8 and 11, the circuit operation manner of this embodiment is similar to that of the embodiment in FIG. 8, and the details will not be described herein again. One of the difference between FIG. 11 and FIG. 8 involves that in FIG. 11, NMOS transistors X1-X4 are respectively connected in series between the NMOS transistors W1-W4 and the PMOS transistors Y1-Y4, so as to respectively raise the trigger voltage of each of the high ESD protection units 1107-1110, thus making the ESD protection device 1103 have a high voltage tolerance.

Figure 12:
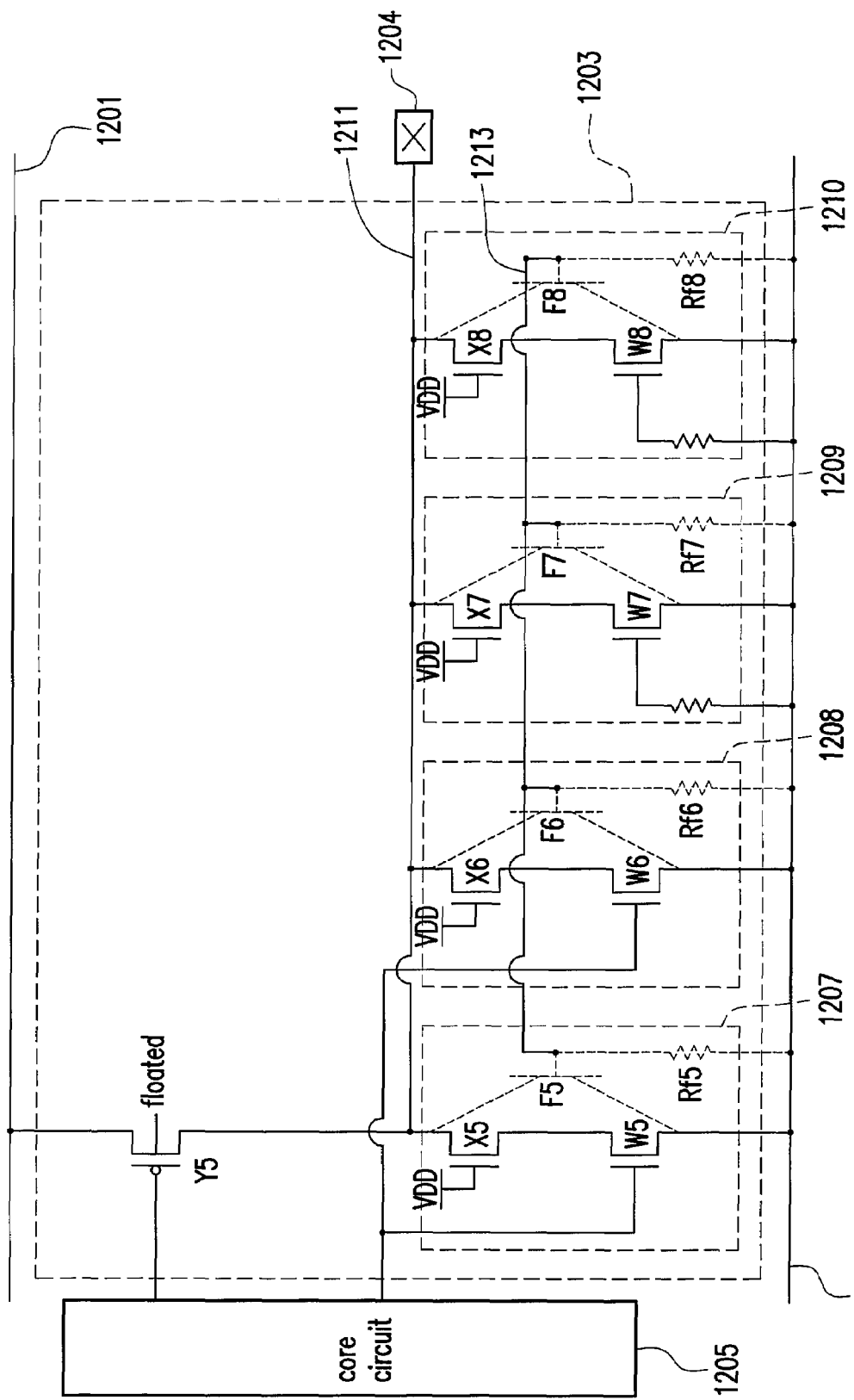
FIG. 12 is an ESD protection device according to a preferred embodiment of the present invention.

FIG. 12 shows an ESD protection device according to a preferred embodiment of the present invention. The ESD protection device 1203 is coupled between a third conductive path (for example, a system voltage trace 1201) and a second conductive path (for example, a ground voltage trace 1202). The ESD protection device 1203 mainly includes output driving units 1207, 1208, ESD protection units 1209, 1210, and a bias conducting wire 1213. Herein, only two output driving units 1207, 1208 and two ESD protection units 1209, 1210 are taken as an example for illustration, and those of ordinary skill in the art can determine the number of the output driving unit and ESD protection unit as required.

The output driving units 1207, 1208 respectively have parasitic transistors F5, F6 and parasitic resistors Rf5, Rf6. The ESD protection units 1209, 1210 respectively have parasitic transistors F7, F8 and parasitic resistors Rf7, Rf8. The bias conducting wire 1213 couples the bases of the parasitic transistors F5-F8 together.

Referring to FIGS. 9 and 12, the circuit operation manner of this embodiment is similar to that of the embodiment in FIG. 9, and the details will not be described herein again. One of the difference between FIG. 12 and FIG. 9 is that, in FIG. 12, NMOS transistors X5-X8 are respectively connected in series between the NMOS transistors W5-W8 and the PMOS transistors Y5, so as to respectively raise the trigger voltage of each of the output driving units 1207, 1208, and each of the ESD protection units 1209, 1210, thus making the ESD protection device 1203 have a high voltage tolerance. It should be noted that though a possible configuration of the ESD protection device has been described in the above embodiment of the present invention, those of ordinary skill in the art should understand that the adopted ESD protection elements are different. For example, NMOS transistors are taken as an example of the ESD protection elements for illustration in the above embodiment, while PMOS transistors can also be used as ESD protection elements to substitute the NMOS transistors. Therefore, the application of the present invention is not limited to this possible configuration. In other words, any configuration that couples the bases of a portion of or all the parasitic transistors inside the ESD protection device together, and provides the parasitic transistors in the ESD protection device with an equal-substrate-potential, for simultaneously triggering the parasitic transistors to bypass the ESD current conforms to the spirit of the present invention.

Figure 13A:
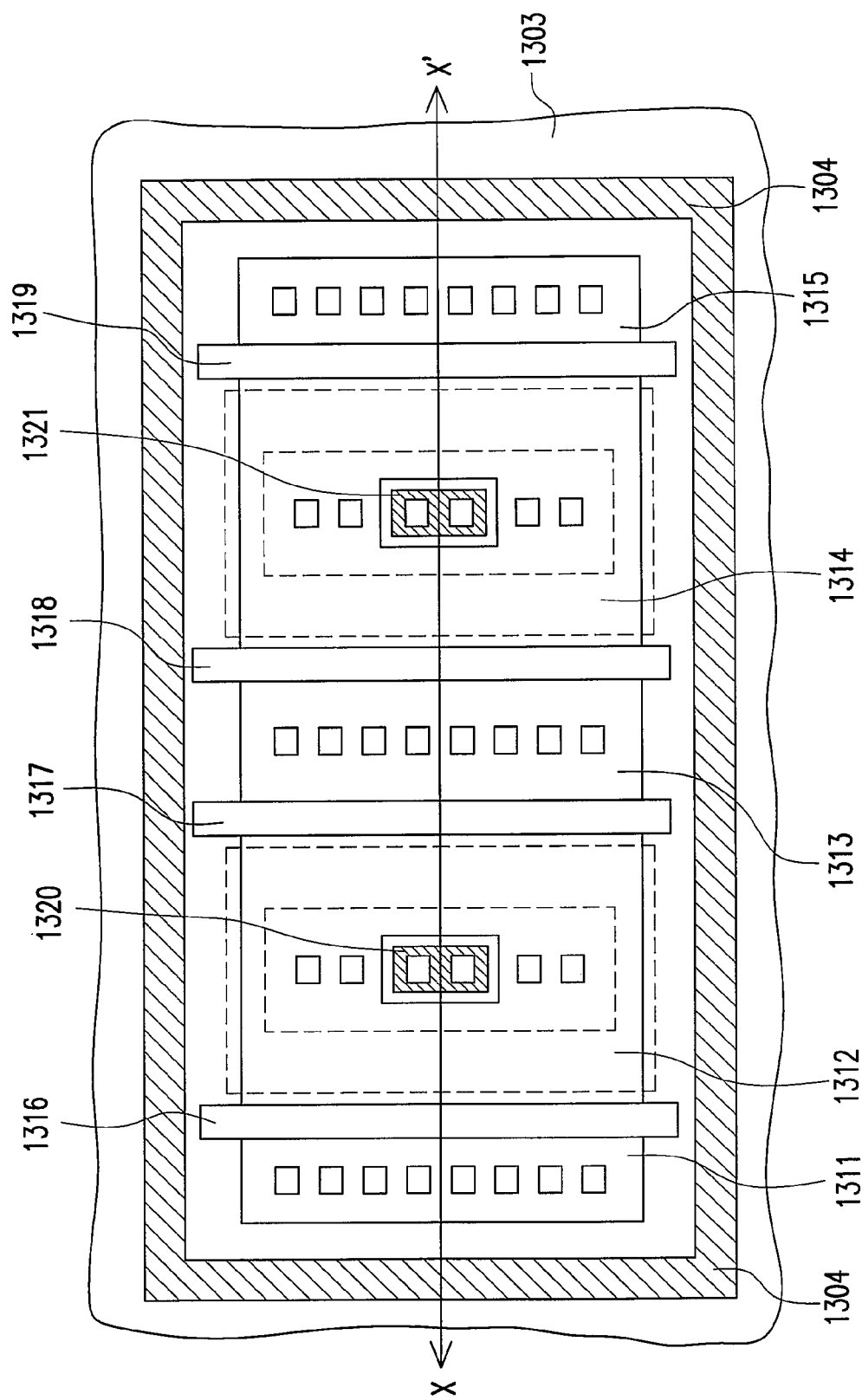
FIG. 13A is a top view of an ESD protection layout according to a preferred embodiment of the present invention.
Figure 13B:
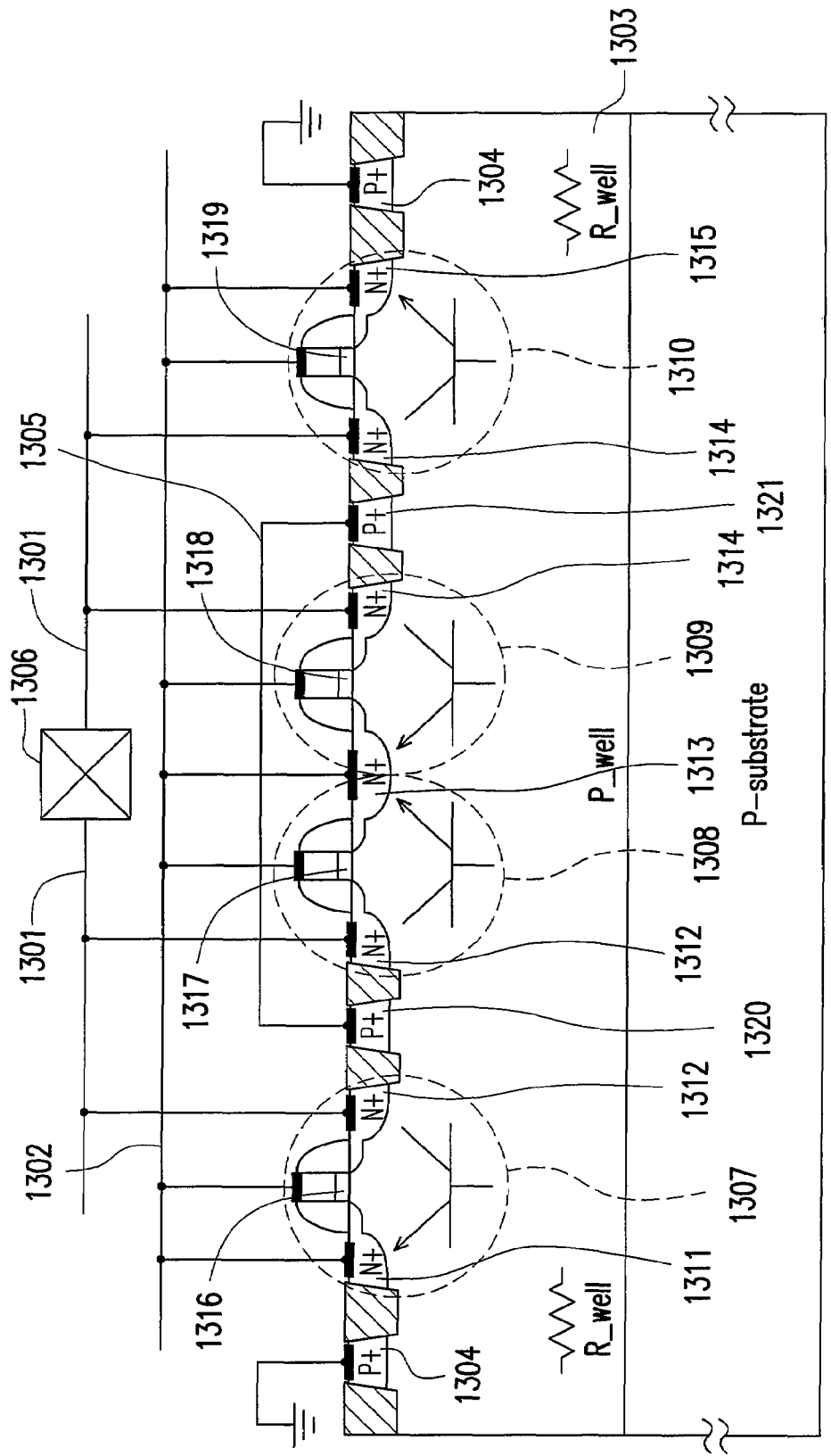
FIG. 13B is a sectional view of an ESD protection layout according to a preferred embodiment of the present invention.

Next, another embodiment is given below to enable those of ordinary skill in the art to implement the above embodiment. FIG. 13A is a top view of the ESD protection layout according to the embodiment in FIG. 7. FIG. 13B is a sectional view of the ESD protection layout according to the embodiment in FIG. 7. Referring to FIGS. 13A and 13B, the ESD protection layout of this embodiment includes a P-type substrate 1303, a first doped region 1304, ESD protection units 1307-1310, second doped regions 1320-1321, a first conductive path 1301, a second conductive path 1302, and a bias conducting wire 1305. Each of the ESD protection units 1307-1310 has an NMOS transistor and a parasitic transistor structure. The substrate 1303 has parasitic resistors inside. The first doped region 1304 is a P+ doped region, which is disposed on the substrate 1303 and coupled to a ground voltage, serving as an electrode of the P-type substrate 1303.

The ESD protection unit 1307 has an NMOS transistor formed by N+ doped regions 1311, 1312 and a gate 1316, and has a parasitic transistor formed by N+ doped regions 1311, 1312 and the P-type substrate 1303. The ESD protection unit 1308 has an NMOS transistor formed by N+ doped regions 1312, 1313 and a gate 1317, and has a parasitic transistor formed by N+ doped regions 1312, 1313 and the P-type substrate 1303. The ESD protection unit 1309 has an NMOS transistor formed by N+ doped regions 1313, 1314 and a gate 1318, and has a parasitic transistor formed by N+ doped regions 1313, 1314 and the P-type substrate 1303. The ESD protection unit 1310 has an NMOS transistor formed by N+ doped regions 1314, 1315 and a gate 1319, and has a parasitic transistor formed by N+ doped regions 1314, 1315 and the P-type substrate 1303.

The ESD protection units 1307-1310 are used to transmit an ESD current between the first conductive path 1301 and the second conductive path 1302. Therefore, the N+ doped regions 1312, 1314 (the drains of the NMOS transistors) are coupled to the first conductive path 1301, wherein the first conductive path 1301 is electrically connected to a pad 1306 (also, an output pad or input pad herein). The N+ doped regions 1311, 1313, 1315 (the sources of the NMOS transistors) and the gates 1316-1319 are coupled to the second conductive path 1302 (also, a ground voltage trace herein).

This embodiment couples the bases of the internal parasitic transistors together via the bias conducting wire 1305, so as to simultaneously trigger the parasitic transistors to bypass the ESD current. In order to electrically connect the bias conducting wire 1305 and the bases of the parasitic transistors, the second doped regions 1320, 1321 are respectively disposed in the N+ doped regions 1312, 1314. The second doped regions 1320, 1321 are respectively isolated from the N+ doped regions 1312, 1314 by a field oxide layer (or other isolation techniques). The second doped regions 1320, 1321 are P+ doped regions, and the bias conducting wire 1305 is electrically connected to the second doped regions 1320, 1321.

In another embodiment of the present invention, each of the ESD protection units 1307-1310 can be implemented by a PMOS transistor, such that the substrate 1303 is an N-type substrate (or an N-type well disposed in a P-type substrate), the first doped region is an N+ doped region and coupled to the system voltage, the second doped regions 1311-1312 are N+ doped regions, and the second conductive path 1302 is a system voltage trace.

Figure 14:
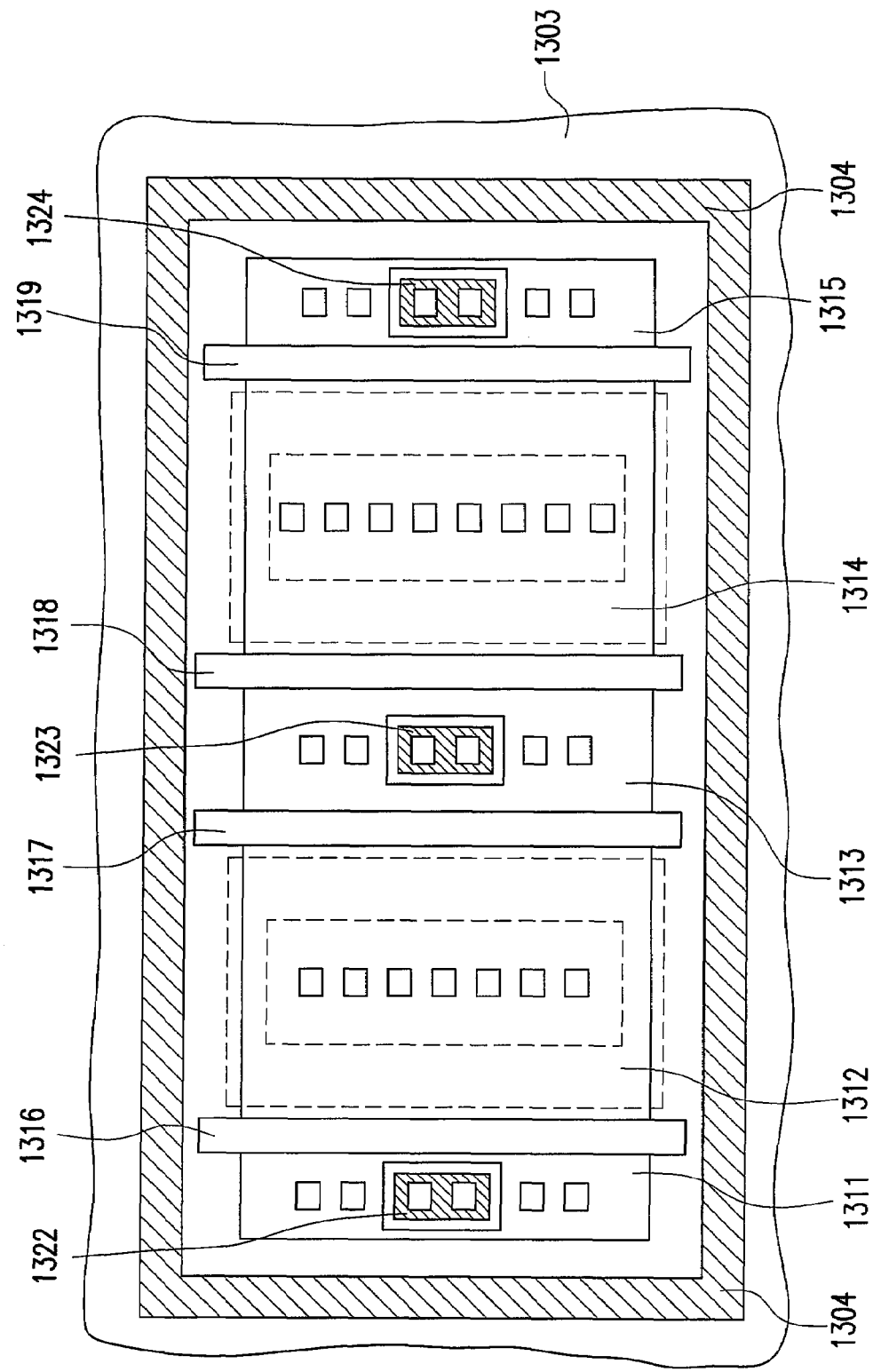
FIG. 14 is a top view of an ESD protection layout according to a preferred embodiment of the present invention.

FIG. 14 is a top view of an ESD protection layout according to a preferred embodiment of the present invention. Referring to FIGS. 14 and 13A, the difference between FIGS. 14 and 13A lies in that second doped regions 1322-1324 are respectively disposed in the N+ doped regions 1311, 1313, 1315. The second doped regions 1322-1324 are respectively isolated from the N+ doped regions 1311, 1313, 1315 by a field oxide layer (or other isolation techniques). The second doped regions 1322-1324 are P+ doped regions, and the bias conducting wire 1305 is electrically connected to the second doped regions 1322-1324, so as to couple the bases of the internal parasitic transistors together.

Figure 15:
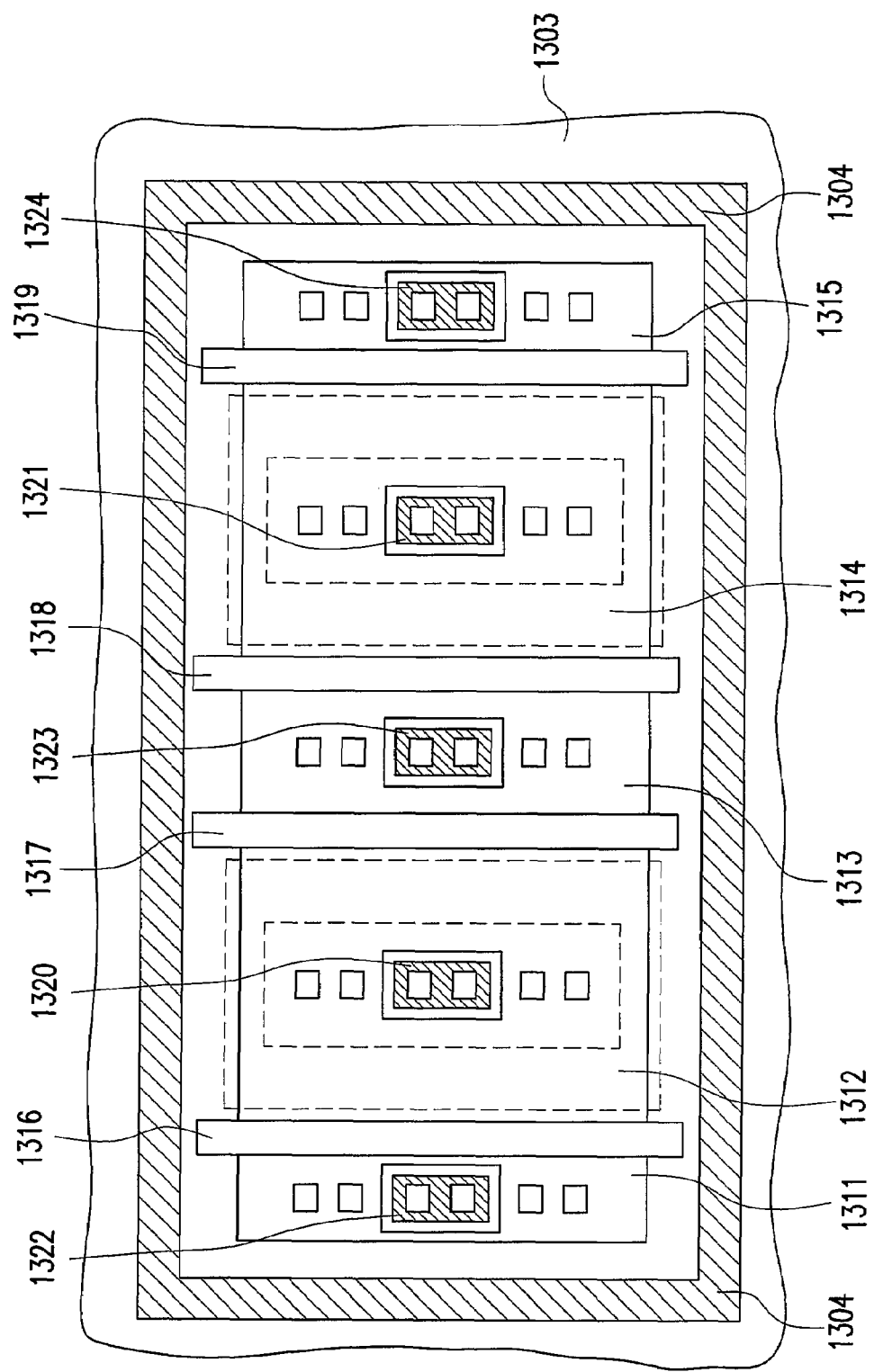
FIG. 15 is a top view of an ESD protection layout according to a preferred embodiment of the present invention.

FIG. 15 is a top view of an ESD protection layout according to a preferred embodiment of the present invention. Referring to FIGS. 15 and 13A, in this embodiment, the second doped regions 1320-1324 are respectively disposed in the N+ doped regions 1311-1315. The second doped regions 1320-1324 are respectively isolated from the N+ doped regions 1311-1315 by a field oxide layer (or other isolation techniques). The second doped regions 1320-1324 are P+ doped regions, and the bias conducting wire 1305 is electrically connected to the second doped regions 1320-1324, so as to couple the bases of the internal parasitic transistors together.

Figure 16A:
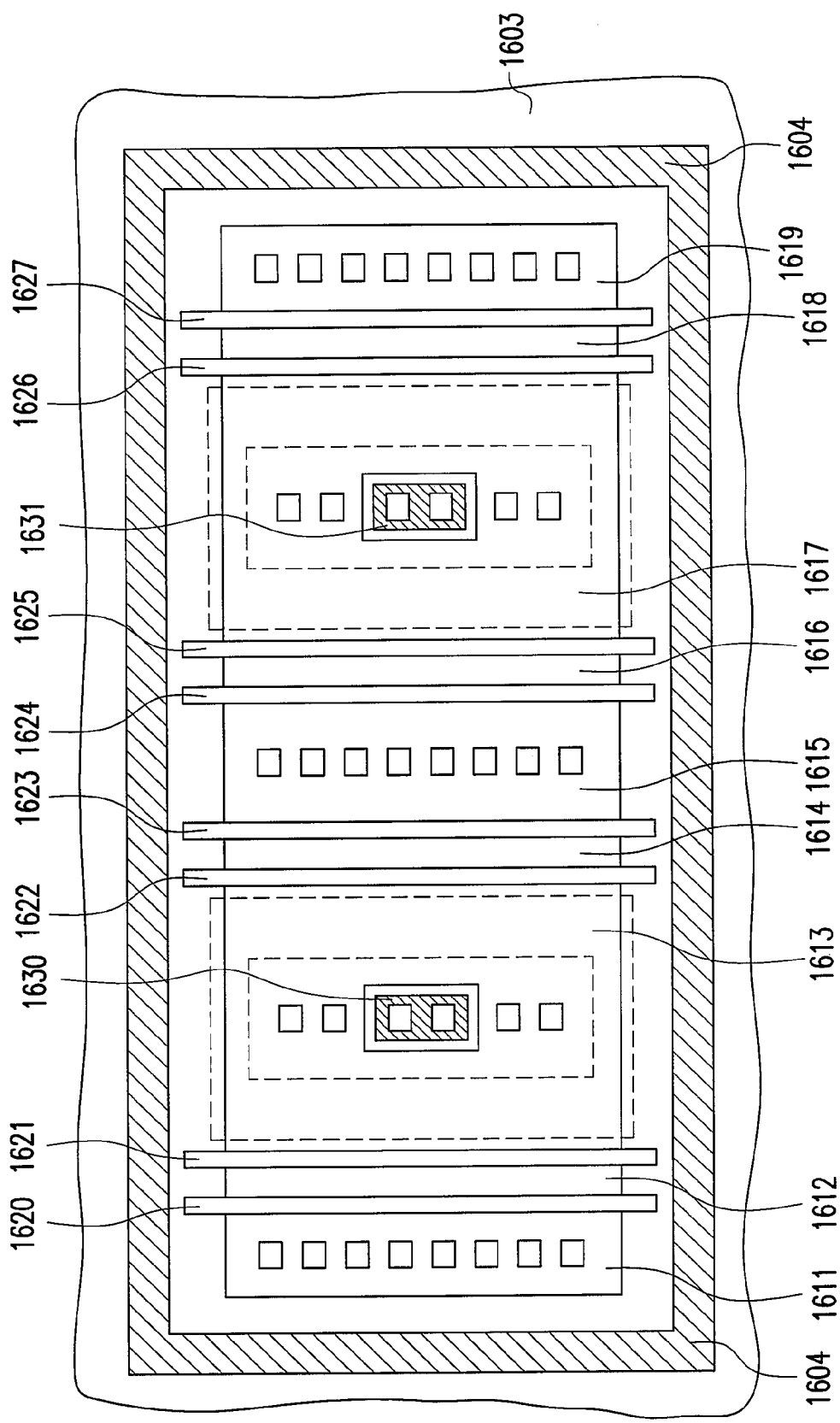
FIG. 16A is a top view of an ESD protection layout according to a preferred embodiment of the present invention.
Figure 16B:
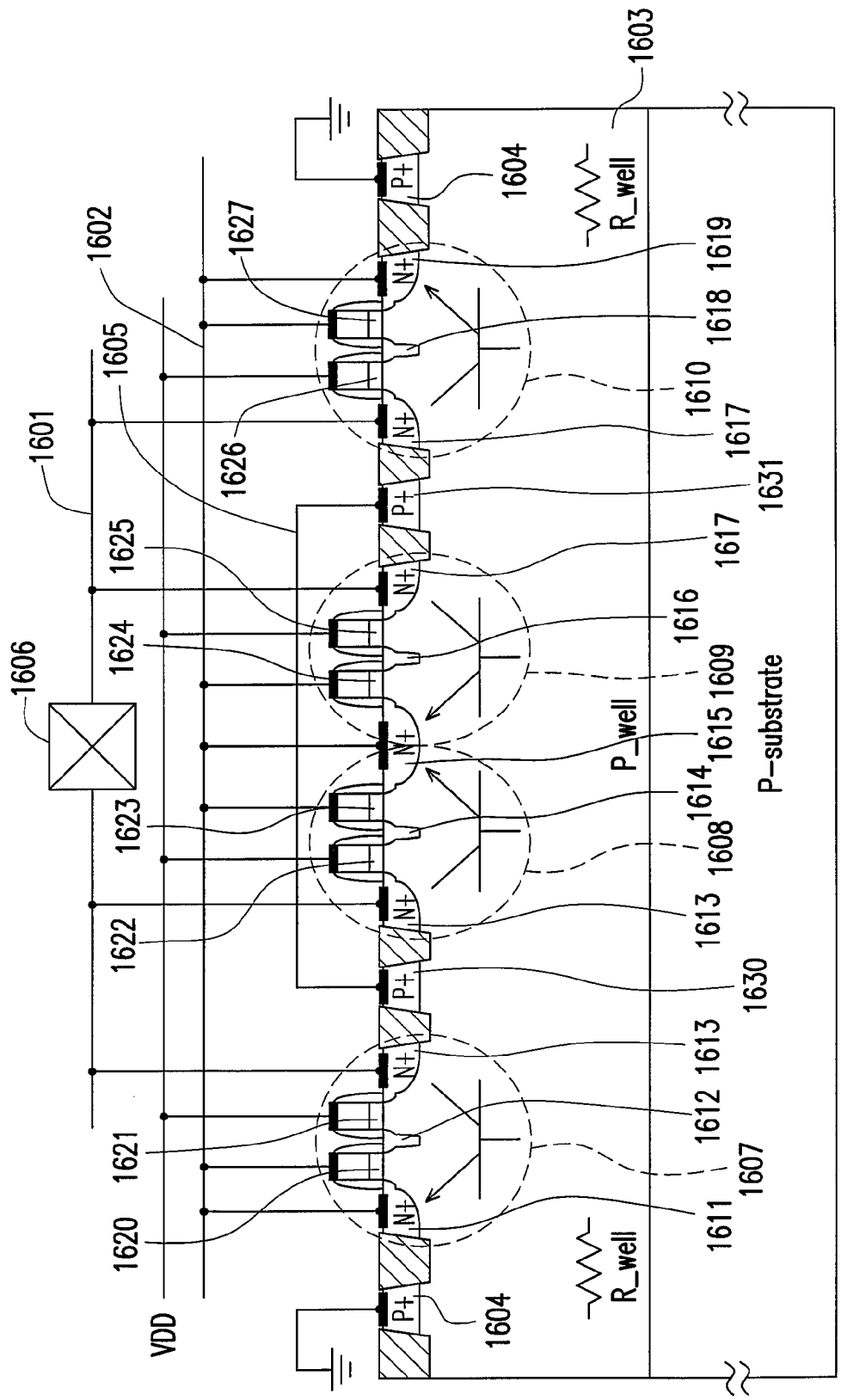
FIG. 16B is a sectional view of an ESD protection layout according to a preferred embodiment of the present invention.

FIG. 16A is a top view of the ESD protection layout according to the embodiment in FIG. 10. FIG. 16B is a sectional view of the ESD protection layout according to the embodiment in FIG. 10. Referring to FIGS. 16A and 16B together, the ESD protection layout of this embodiment includes a P-type substrate 1603, a first doped region 1604, ESD protection units 1607-1610, second doped regions 1630-1631, N+ doped regions 1611-1619, a first conductive path 1601, a second conductive path 1602, and a bias conducting wire 1605. The P-type substrate 1603 has parasitic resistors inside. The ESD protection units 1607-1610 are implemented by NMOS transistors. The first doped region 1604 is a P+ doped region, which is disposed in the P-type substrate 1603 and coupled to a ground voltage trace, serving as an electrode of the substrate 1603.

The ESD protection unit 1607 has two serially connected NMOS transistors formed by the N+ doped regions 1611-1613 and gates 1620-1621, and has a parasitic transistor formed by the N+ doped regions 1611, 1613 and the substrate 1603. The ESD protection unit 1608 has two serially connected NMOS transistors formed by the N+ doped regions 1613-1615 and gates 1622-1623, and has a parasitic transistor formed by the N+ doped regions 1613, 1615 and the substrate 1603. The ESD protection unit 1609 has two serially connected NMOS transistors formed by the N+ doped regions 1615-1617 and gates 1624-1625, and has a parasitic transistor formed by the N+ doped regions 1615, 1617 and the substrate 1603. The ESD protection unit 1610 has two serially connected NMOS transistors formed by the N+ doped regions 1617-1619 and gates 1626-1627, and has a parasitic transistor formed by the N+ doped regions 1617, 1619 and the substrate 1603.

The ESD protection units 1607-1610 are used to transmit an ESD current between the first conductive path 1601 and the second conductive path 1602. Therefore, the N+ doped regions 1613, 1617 are coupled to the first conductive path 1601, wherein the first conductive path 1601 is electrically connected to a pad 1606 (an output pad or input pad herein). The N+ doped regions 1611, 1615, 1619 and the gates 1620, 1623, 1624, 1627 are coupled to the second conductive path 1602 (a ground voltage trace herein). In addition, the gates 1621, 1622, 1625, 1626 are coupled to the system voltage VDD.

This embodiment couples the bases of the internal parasitic transistors together via the bias conducting wire 1605, so as to simultaneously trigger the parasitic transistors to bypass the ESD current. In order to electrically connect the bias conducting wire 1605 and the bases of the parasitic transistors, the second doped regions 1630-1631 are respectively disposed in the N+ doped regions 1613, 1617. The second doped regions 1630-1631 are respectively isolated from the N+ doped regions 1613, 1617 by a field oxide layer (or other isolation techniques). The second doped regions 1630-1631 are P+ doped regions, and the bias conducting wire 1605 is electrically connected to the second doped regions 1630-1631.

In another embodiment of the present invention, each of the ESD protection units 1607-1610 can be implemented by two serially connected PMOS transistors, such that the substrate 1603 is an N-type substrate (or an N-type well disposed in a P-type substrate), the first doped region is an N+ doped region and coupled to the system voltage, the second doped regions 1630-1631 are N+ doped regions, and the second conductive path 1602 is a system voltage trace.

Figure 17:
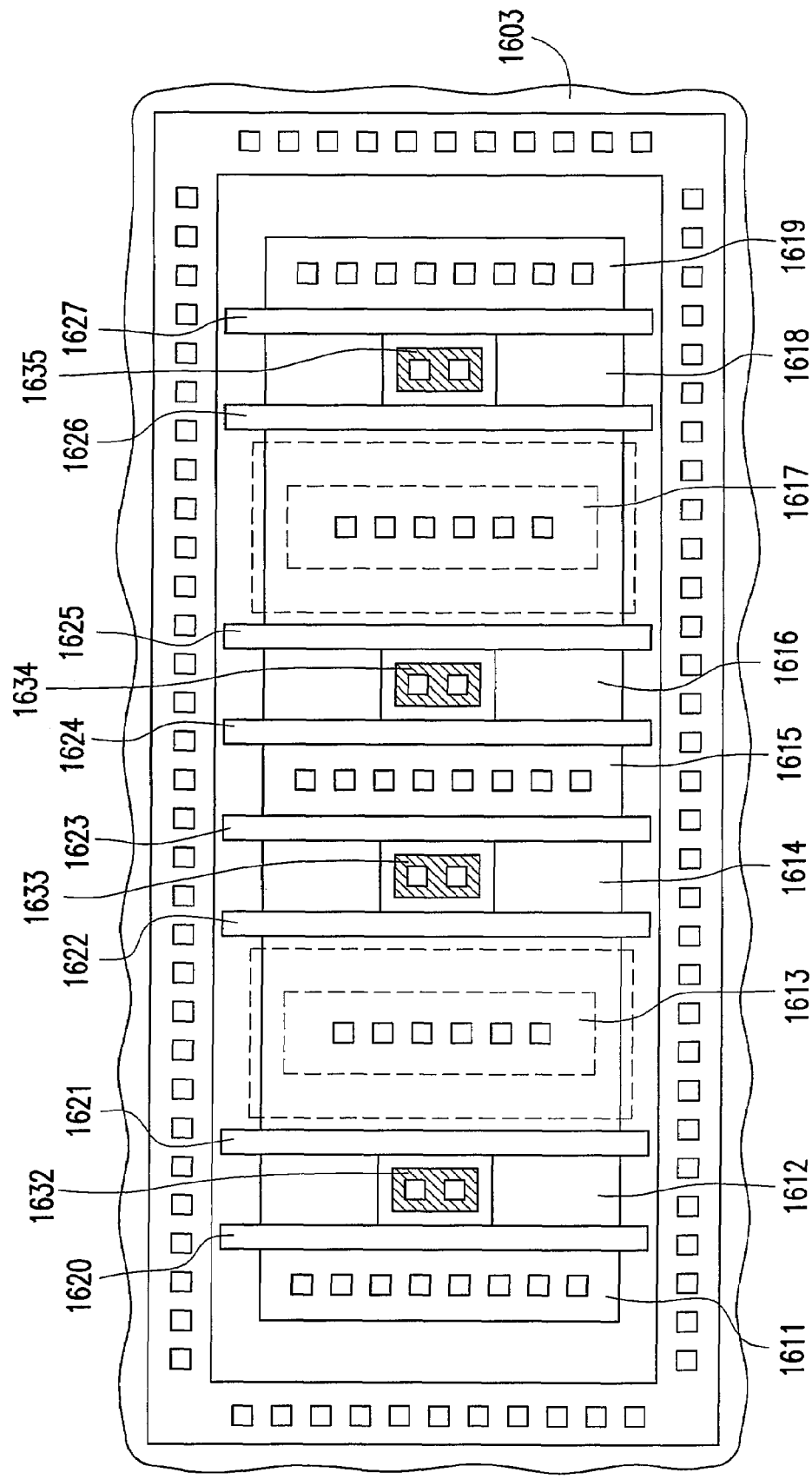
FIG. 17 is a top view of an ESD protection layout according to a preferred embodiment of the present invention.

FIG. 17 is a top view of an ESD protection layout according to a preferred embodiment of the present invention. Referring to FIGS. 17 and 16A, the difference between FIGS. 17 and 16A lies in that third doped regions 1632-1635 are respectively disposed in the N+ doped regions 1612, 1614, 1616, 1618. The third doped regions 1632-1635 are respectively isolated from the N+ doped regions 1612, 1614, 1616, 1618 by a field oxide layer (or other isolation techniques). The third doped regions 1632-1635 are P+ doped regions, and the bias conducting wire 1605 is electrically connected to the third doped regions 1632-1635, so as to couple the bases of the internal parasitic transistors together.

Figure 18:
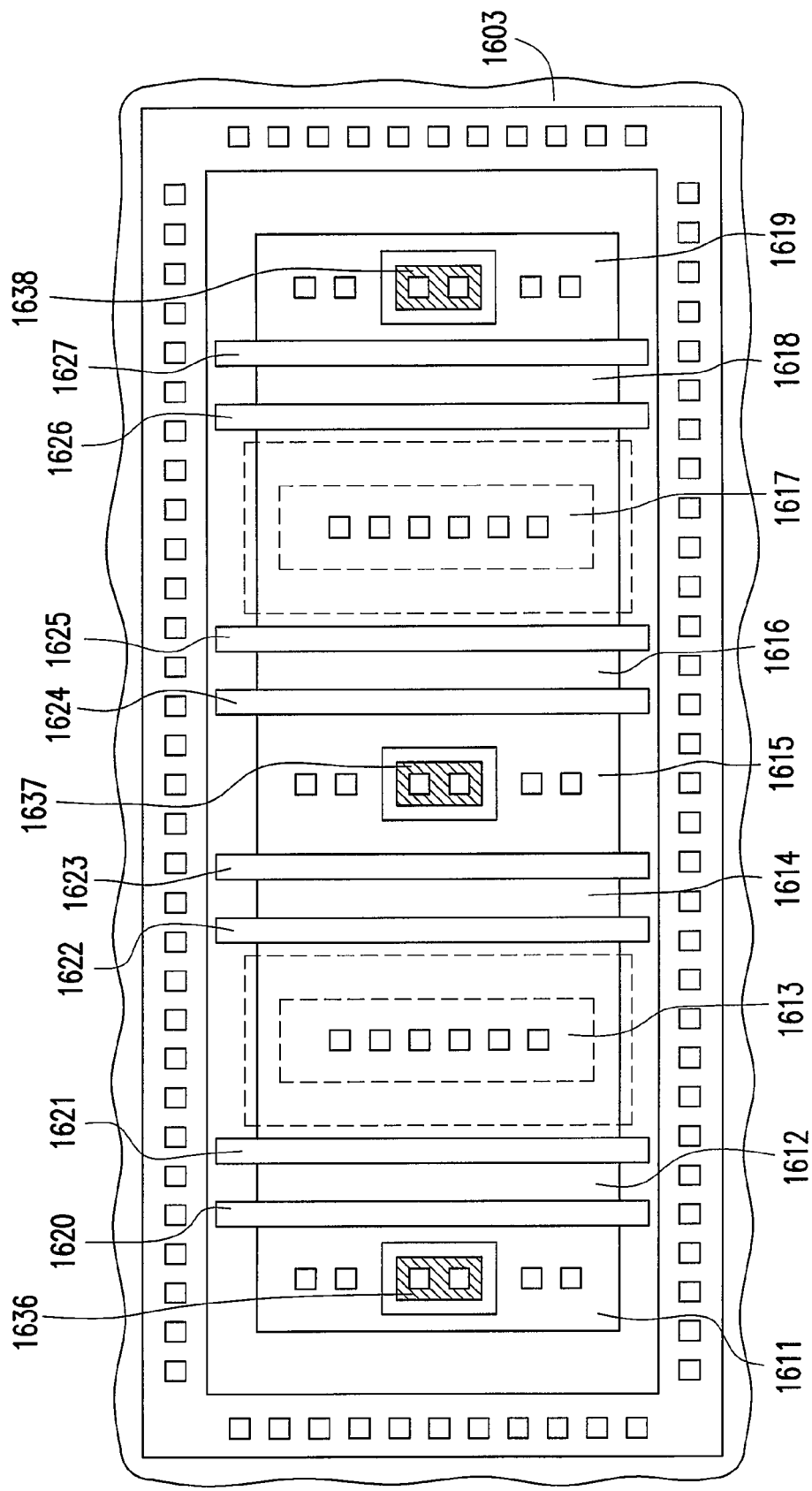
FIG. 18 is a top view of an ESD protection layout according to a preferred embodiment of the present invention.

FIG. 18 is a top view of an ESD protection layout according to a preferred embodiment of the present invention. Referring to FIGS. 18 and 16A, in this embodiment, P+ doped regions 1636-1638 are respectively disposed in the N+ doped regions 1611, 1615, 1619. The second doped regions 1636-1638 are respectively isolated from the N+ doped regions 1611, 1615, 1619 by a field oxide layer (or other isolation techniques). The bias conducting wire 1605 is electrically connected to the second doped regions 1636-1638, so as to couple the bases of the internal parasitic transistors together.

Figure 19:
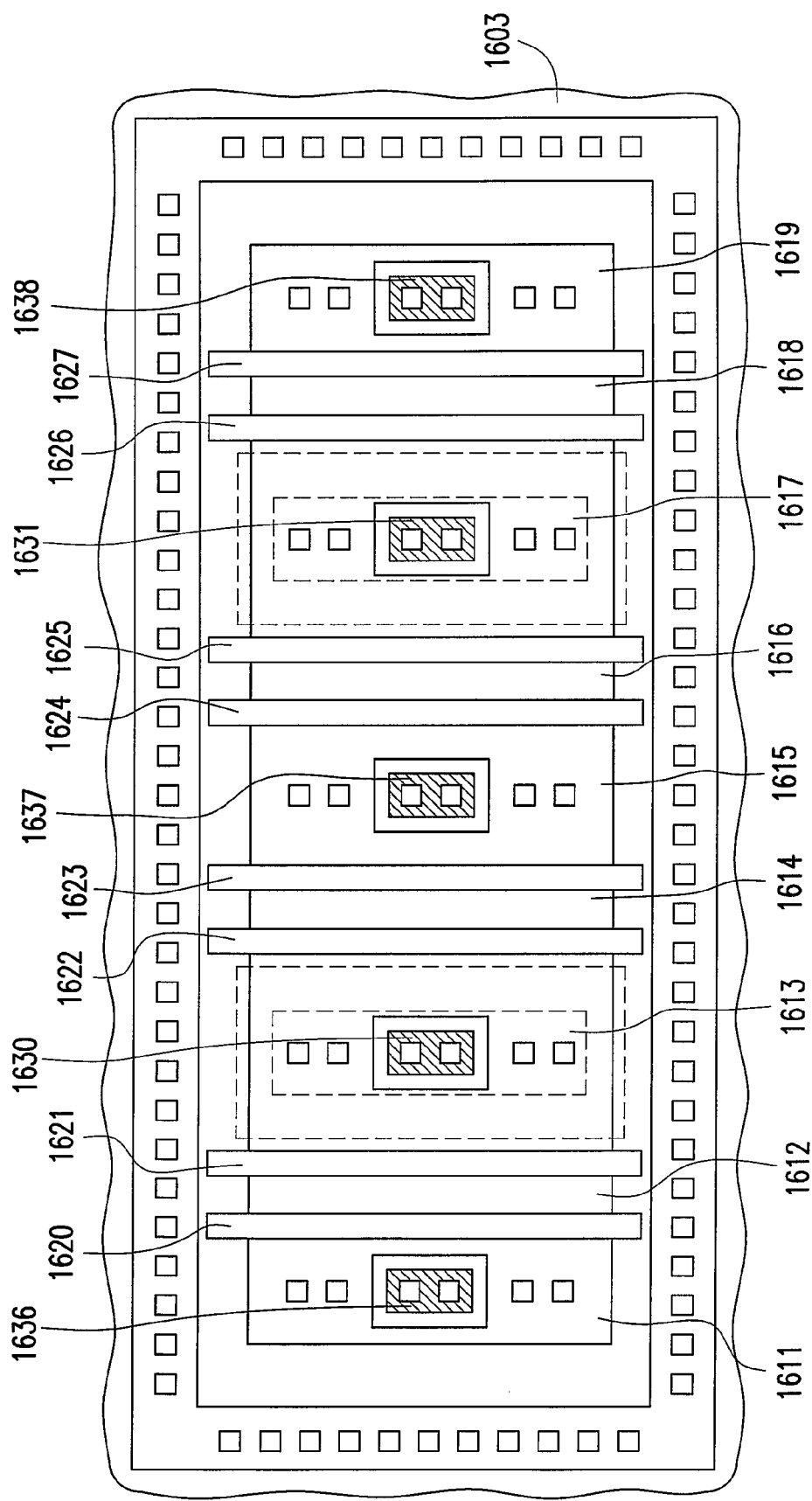
FIG. 19 is a top view of an ESD protection layout according to a preferred embodiment of the present invention.

FIG. 19 is a top view of an ESD protection layout according to a preferred embodiment of the present invention. Referring to FIGS. 19 and 16A, in this embodiment, the second doped regions 1636, 1630, 1637, 1631, 1638 are respectively disposed in the N+ doped regions 1611, 1613, 1615, 1617, 1619. The second doped regions 1636, 1630, 1637, 1631, 1638 are respectively isolated from the N+ doped regions 1611, 1613, 1615, 1617, 1619 by a field oxide layer (or other isolation techniques). The second doped regions 1630-1631, 1636-1638 are P+ doped regions, and the bias conducting wire 1605 is electrically connected to the second doped regions 1630-1631, 1636-1638, so as to couple the bases of the internal parasitic transistors together.

In view of the above, the ESD protection device provided by the present invention couples the bases of the parasitic transistors inside the ESD protection elements together, for simultaneously triggering the parasitic transistors to bypass the ESD current when the ESD occurs, thus solving the non-uniform problem of bypassing the ESD current. Moreover, the ESD protection device can be used as an output buffer to enhance the output driving ability of the core circuit. As for the layout of the ESD protection device, another doped region is added onto the substrate neighboring to the doped regions of the ESD protection elements. However, the added doped region cannot contact the doped regions of the ESD protection element, but is electrically connected thereto, so as to make the bases of the parasitic transistors coupled together without using extra layout area.

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims.

What is claimed is:

1. An electrostatic discharge (ESD) protection device, comprising:
   a plurality of ESD protection units, for transmitting an electrostatic current between a first conductive path and a second conductive path, wherein each ESD protection unit comprises:
      a parasitic transistor, with a collector and an emitter respectively coupled to the first conductive path and the second conductive path; and
      a parasitic resistor, coupled between a base of the parasitic transistor and the second conductive path; and
   a bias conducting wire, coupled to each base of the parasitic transistors.

2. The ESD protection device as claimed in claim 1, wherein the second conductive path is a system voltage trace.

3. The ESD protection device as claimed in claim 1, wherein the second conductive path is a ground voltage trace.

4. The ESD protection device as claimed in claim 1, wherein the first conductive path is coupled to an input pad.

5. The ESD protection device as claimed in claim 1, wherein the first conductive path is coupled to an output pad.

6. The ESD protection device as claimed in claim 1, wherein each ESD protection unit further comprises:
   a metal-oxide-semiconductor (MOS) transistor, with a drain and a source respectively coupled to the first conductive path and the second conductive path and with a gate coupled to the second conductive path.

7. The ESD protection device as claimed in claim 1, wherein each ESD protection unit further comprises:
   a MOS transistor, with a drain and a source respectively coupled to the first conductive path and the second conductive path and with a gate floating.

8. The ESD protection device as claimed in claim 1, wherein each ESD protection unit further comprises:
   a first MOS transistor; and
   a second MOS transistor, wherein the first and second MOS transistors are connected in series between the first conductive path and the second conductive path, and the gates of the first and second MOS transistors are respectively coupled to the second conductive path and a third conductive path.

9. The ESD protection device as claimed in claim 8, wherein the third conductive path is a system voltage trace, and the second conductive path is a ground voltage trace.

10. An ESD protection device, comprising:
    a plurality of output driving units, for generating an external output signal according to a core output signal and outputting the external output signal to a first conductive path, wherein each output driving unit comprises:
       a parasitic transistor, with a collector and an emitter respectively coupled to the first conductive path and a second conductive path; and
       a parasitic resistor, coupled between a base of the parasitic transistor and the second conductive path; and
    a bias conducting wire, coupled to each base of the parasitic transistors.

11. The ESD protection device as claimed in claim 10, wherein the first conductive path is coupled to an output pad.

12. The ESD protection device as claimed in claim 10, wherein the second conductive path is a system voltage trace.

13. The ESD protection device as claimed in claim 10, wherein the second conductive path is a ground voltage trace.

14. The ESD protection device as claimed in claim 10, wherein each output driving unit further comprises:
    an MOS transistor, with a drain and a source respectively coupled to the first conductive path and the second conductive path and with a gate receiving the core output signal.

15. The ESD protection device as claimed in claim 10, wherein each output driving unit further comprises:
    a first MOS transistor; and
    a second MOS transistor, wherein the first and second MOS transistors are connected in series between the first conductive path and the second conductive path, the gate of the first MOS transistor is coupled to a third conductive path, and the gate of the second MOS transistor receives the core output signal.

16. The ESD protection device as claimed in claim 15, wherein the third conductive path is a system voltage trace, and the second conductive path is a ground voltage trace.

17. An ESD protection device, comprising:
    a plurality of transistors, with a collector and an emitter of each transistor respectively coupled to a first conductive path and a second conductive path, for transmitting an electrostatic current between a first conductive path and a second conductive path;

a plurality of resistors, respectively coupled between the base of the corresponding transistor and the second conductive path; and a bias conducting wire, coupled to each base of the transistors.

18. The ESD protection device as claimed in claim 17, wherein the first conductive path is coupled to an input pad.

19. The ESD protection device as claimed in claim 17, wherein the first conductive path is coupled to an output pad.

20. The ESD protection device as claimed in claim 17, wherein the second conductive path is a system voltage trace.

21. The ESD protection device as claimed in claim 17, wherein the second conductive path is a ground voltage trace.

22. An ESD protection layout, comprising:
a substrate, having a parasitic resistor;
a first doped region, disposed on the substrate and serving as an electrode of the substrate;
a first conductive path, disposed above the substrate;
a second conductive path, disposed above the substrate;
a plurality of ESD protection units, disposed on the substrate without contacting the first doped region, for transmitting an electrostatic current between the first conductive path and the second conductive path, wherein each ESD protection unit has a parasitic transistor structure;
a plurality of second doped regions, disposed on the substrate and between the ESD protection units, wherein the second doped regions do not contact the ESD protection units; and
a bias conducting wire, disposed above the substrate, wherein the bias conducting wire is electrically connected to each of the second doped regions.

23. The ESD protection layout as claimed in claim 22, further comprising:
a pad, wherein the first conductive path is electrically connected to the input pad.

24. The ESD protection layout as claimed in claim 22, wherein the second conductive path is a system voltage trace.

25. The ESD protection layout as claimed in claim 22, wherein the second conductive path is a ground voltage trace.

26. The ESD protection layout as claimed in claim 22, wherein each ESD protection unit comprises:
an MOS transistor, with a drain and a source respectively coupled to the first conductive path and the second conductive path and with a gate coupled to the second conductive path.

27. The ESD protection layout as claimed in claim 22, wherein each ESD protection unit comprises:
an MOS transistor, with a drain and a source respectively coupled to the first conductive path and the second conductive path and with a gate floating.

28. The ESD protection layout as claimed in claim 22, wherein each ESD protection unit comprises:
a first MOS transistor; and
a second MOS transistor, wherein the first and second MOS transistors are connected in series between the first conductive path and the second conductive path.

29. The ESD protection layout as claimed in claim 28, wherein the gates of the first and second MOS transistors are respectively coupled to the second conductive path and a third conductive path.

30. The ESD protection layout as claimed in claim 29, wherein the third conductive path is a system voltage trace, and the second conductive path is a ground voltage trace.

31. The ESD protection layout as claimed in claim 29, wherein the second conductive path is a system voltage trace, and the third conductive path is a ground voltage trace.

32. The ESD protection layout as claimed in claim 28, further comprising:
a plurality of third doped regions, disposed in the substrate and between the first and second MOS transistors without contacting the first and second MOS transistors, wherein the third doped regions are electrically connected to the bias conducting wire.

33. The ESD protection layout as claimed in claim 32, wherein the third doped regions are isolated from the first and second MOS transistors by field oxide layers.

34. The ESD protection layout as claimed in claim 32, wherein the second doped regions are isolated from the ESD protection units by field oxide layers.

35. An ESD protection layout, comprising:
a substrate;
a first doped region, disposed on the substrate and serving as an electrode of the substrate;
a first conductive path, disposed above the substrate;
a second conductive path, disposed above the substrate;
a plurality of ESD protection units, disposed on the substrate without contacting the first doped region, for transmitting an electrostatic current between the first conductive path and the second conductive path, wherein each ESD protection unit comprises:
a first MOS transistor; and
a second MOS transistor, wherein the first and second MOS transistors are connected in series between the first conductive path and the second conductive path;
a plurality of third doped regions, disposed in the substrate and between the first and second MOS transistors without contacting the first and second MOS transistors; and
a bias conducting wire, disposed above the substrate, wherein the bias conducting wire is electrically connected to each of the third doped regions.

36. The ESD protection layout as claimed in claim 35, wherein the first conductive path is coupled to a pad.

37. The ESD protection layout as claimed in claim 35, wherein the second conductive path is a system voltage trace.

38. The ESD protection layout as claimed in claim 35, wherein the second conductive path is a ground voltage trace.

39. The ESD protection layout as claimed in claim 35, wherein the third doped regions are isolated from the first and second MOS transistors by field oxide layers.

* * * * *